(12) United States Patent
Komori et al.

(10) Patent No.: US 7,397,872 B2
(45) Date of Patent: Jul. 8, 2008

(54) AUTOMATIC GAIN CONTROL CIRCUIT AND METHOD THEREOF AND DEMODULATION APPARATUS USING THE SAME

(75) Inventors: Kenji Komori, Kanagawa (JP); Masataka Wakamatsu, Kanagawa (JP); Hideaki Sato, Saitama (JP); Takashi Usui, Tokyo (JP); Kazuyuki Saijo, Tokyo (JP); Shinichi Tanabe, Kanagawa (JP); Hideo Morohashi, Kanagawa (JP); Kazuhiro Fujimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 816 days.

(21) Appl. No.: 10/362,295

(22) PCT Filed: Jun. 25, 2002

(86) PCT No.: PCT/JP02/06364

§ 371 (c)(1),
(2), (4) Date: Aug. 4, 2003

(87) PCT Pub. No.: WO03/001714

PCT Pub. Date: Jan. 3, 2003

(65) Prior Publication Data

US 2004/0037378 A1 Feb. 26, 2004

(30) Foreign Application Priority Data

Jun. 25, 2001 (JP) ............................. 2001-190994

(51) Int. Cl.
*H04L 27/08* (2006.01)
*H04B 7/00* (2006.01)

(52) U.S. Cl. .................................. 375/345; 455/234.1

(58) Field of Classification Search ................. 375/345, 375/134, 137, 145, 149, 260, 318; 330/254; 370/208, 335, 342; 455/232.1, 234.1, 245.1, 455/250, 1
See application file for complete search history.

(56) References Cited

U.S. PATENT DOCUMENTS 5,305,109 A * 4/1994 Harford ....................... 348/737
5,944,842 A * 8/1999 Propp et al. .................. 714/701
6,034,999 A * 3/2000 Kirisawa ...................... 375/295

(Continued)

FOREIGN PATENT DOCUMENTS

JP 06-029942 2/1994

(Continued)

*Primary Examiner*—Young T. Tse
(74) *Attorney, Agent, or Firm*—Frommer Lawrence & Haug LLP; William S. Frommer

(57) ABSTRACT

An automatic gain control circuit able to perform high speed and correct level acquisition, able to prevent occurrence of error, and able to prevent a crash of the system. An amplification gain controller outputs a gain control signal to an automatic gain control amplifier to amplify the received signal with maximum value when receiving a burst detection trigger signal. A second gain control signal based on the detected reception signal power is calculated when receiving a first burst synchronization detection signal; and this second gain control signal is output to the automatic gain control amplifier. A received digital signal is amplified with the second gain and integrated to find the reception signal power, from which a third gain control signal is calculated and outputted to the automatic gain control amplifier to amplify the received signal with this third gain.

56 Claims, 20 Drawing Sheets

U.S. PATENT DOCUMENTS

| | | | |
|---|---|---|---|
| 6,188,277 B1 * | 2/2001 | Borodulin et al. | 330/51 |
| 6,307,443 B1 * | 10/2001 | Gabara | 333/17.1 |
| 6,370,210 B1 | 4/2002 | Yamamoto | |
| 6,449,322 B1 * | 9/2002 | Mackenthun | 375/329 |
| 6,714,784 B1 * | 3/2004 | Forssell et al. | 455/436 |
| 6,795,490 B2 * | 9/2004 | Belotserkovsky | 375/150 |
| 6,843,597 B1 * | 1/2005 | Li et al. | 375/345 |
| 7,068,987 B2 * | 6/2006 | Baldwin et al. | 455/232.1 |
| 2003/0032402 A1 * | 2/2003 | Asano | 455/234.1 |
| 2003/0043947 A1 * | 3/2003 | Zehavi et al. | 375/365 |
| 2003/0058037 A1 * | 3/2003 | Makita et al. | 329/304 |

FOREIGN PATENT DOCUMENTS

| | | |
|---|---|---|
| JP | 11-205278 | 7/1999 |
| JP | 11-341091 | 12/1999 |
| JP | 2002-176411 | 6/2002 |

* cited by examiner

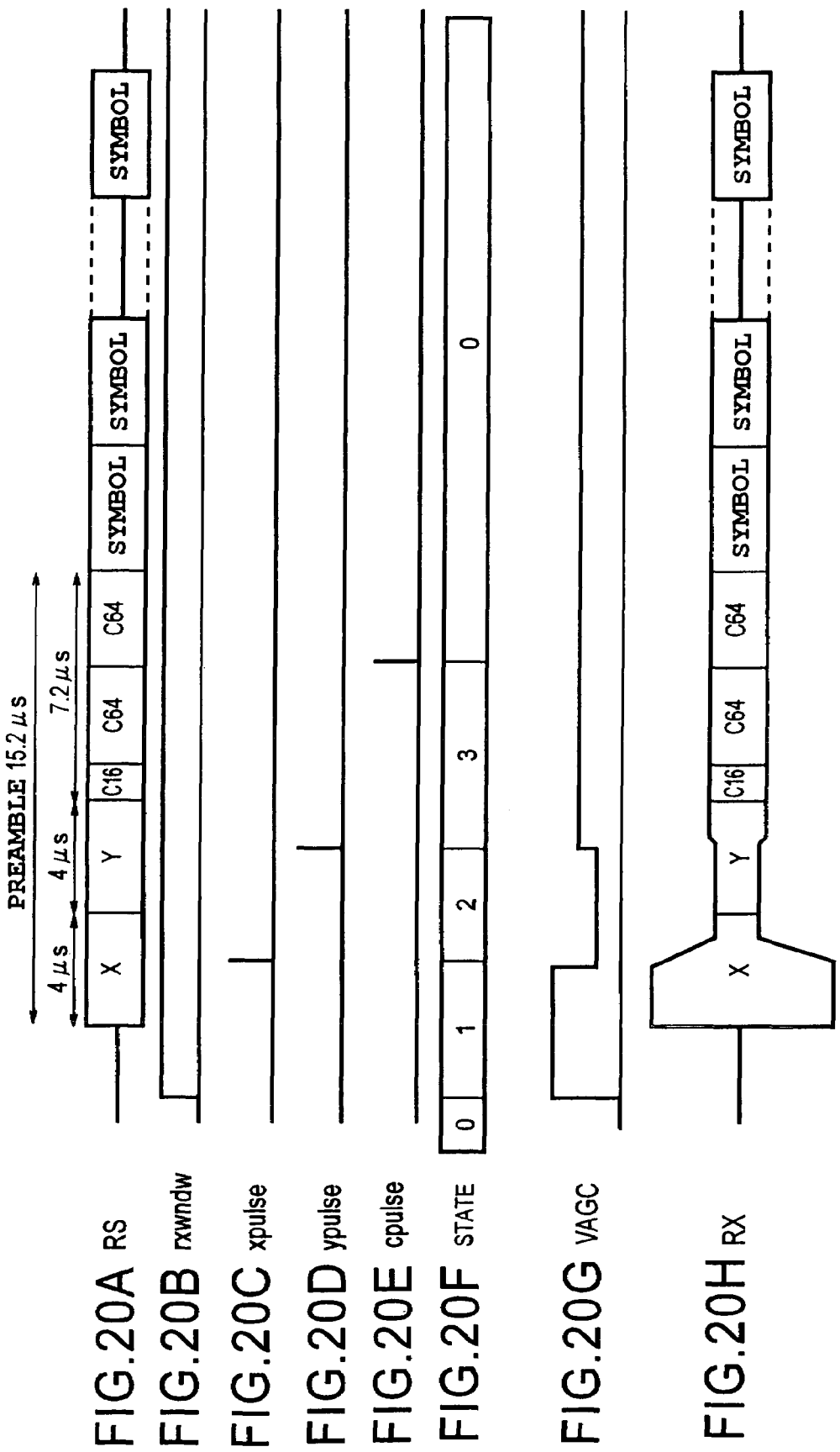

AUTOMATIC GAIN CONTROL CIRCUIT AND METHOD THEREOF AND DEMODULATION APPARATUS USING THE SAME

TECHNICAL FIELD

The present invention relates to an automatic gain control circuit applied to a receiver etc. of a wireless communication system and a method of the same and a demodulation apparatus using the same, more particularly relates to an automatic gain control circuit applied to for example a wireless communication system for receiving a radio signal which is modulated by an orthogonal frequency division multiplexing (OFDM) modulation method and includes a burst signal including a preamble signal at the header of this modulated packet signal, and a method of the same, and a demodulation apparatus using the same.

BACKGROUND ART

In a digital demodulation apparatus, there is a limit to the dynamic range of an analog-to-digital (A/D) converter for converting an analog signal to a digital signal.

For this reason, a digital signal converted exceeding the dynamic range of the A/D converter will be output in a form including signal distortion.

Further, in a system where a large number of apparatuses communicate as in a wireless LAN system or other wireless communication system, the reception signal levels will differ largely according to transmission outputs of the individual apparatuses and the distance between apparatuses.

Accordingly, in the wireless communication system, it is necessary to adjust the reception signal level within the dynamic range of the A/D converter. For this reason, a synchronization demodulation apparatus of a wireless communication system mounts an automatic gain control (AGC) circuit as a circuit for adjusting the reception signal level to within the dynamic range of the A/D converter.

Further, in the wireless communication system, a burst signal referred to as a preamble signal is transmitted inserted at the header of the modulated signal.

Further, the AGC circuit mounted in the synchronization demodulation apparatus synchronizes the timing to within the period of this burst signal, while controls the amplification gain based on the received level of the burst signal.

In this way, various circuits have been proposed as the AGC circuit able to be applied to a wireless communication system using so-called burst synchronization.

FIG. 1 is a block diagram of an example of the configuration of a demodulation apparatus mounting a conventional AGC circuit able to be applied to a wireless communication system using burst synchronization.

The apparatus of FIG. 1 is disclosed in Japanese Unexamined Patent Publication (Kokai) No. 11-205278.

This demodulation apparatus 10, as shown in FIG. 1, is comprised of an automatic gain control amplifier (AGCAMP) 101, A/D converter (ADC) 102, OFDM demodulator (DEMOD) 103, delay unit (DLY) 104, burst detector (BDT) 105, packet detector (PDT) 106, and amplification gain controller (AGCTL) 107.

In a demodulation apparatus 10 having such a configuration, an OFDM reception signal RS received by a not illustrated antenna is input to the automatic gain control amplifier 101.

In the automatic gain control amplifier 101, the reception signal RS is automatically controlled in gain and output as the optimum signal level to the A/D converter 102. Note that, the automatic gain control amplifier 101 controls the case of automatic gain control by a control signal S107 by the amplification gain controller 107 and the case where the control gain is fixed.

The A/D converter 102 converts the input reception signal from an analog signal to digital signal and outputs a digital reception signal S102 to the OFDM demodulator 103, delay unit 104, and burst detector 105.

The OFDM demodulator 103 applies a discrete Fourier transform to the digital reception signal S102 based on the output of the burst detector 105 to demodulate the OFDM signal and outputs this demodulated signal S103 to the packet detector 106 and following processing circuit.

The delay unit 104 delays the digital reception signal S102 by the amount of the burst period and outputs the result as the signal S104 to the burst detector 105.

The burst detector 105 establishes correlation between the digital reception signal S102 and the delay signal S104, detects the burst signal of the period determined by the communication system, and outputs the detected result as the signal S105 to the OFDM demodulator 103 and the amplification gain controller 107.

Further, the packet detector 106 detects a unique word of the packet header from the demodulation signal S103 by the OFDM demodulator 103, detects whether or not the packets were correctly demodulated, detects the end time of the packets, and outputs the detected result as the signal S106 to the amplification gain controller 107.

The amplification gain controller 107 judges whether or not to fix the automatic gain control of the automatic gain control amplifier 101 based on the output signal S105 by the burst detector 105 and the output signal S106 of the packet detector 106 and outputs the judged result as the control signal S107 to the automatic gain control amplifier 101.

In this way, the demodulation apparatus of FIG. 1 fixes or changes the control gain in the automatic gain control amplifier 101 according to whether or not the burst synchronization was established in the burst synchronization system, so it is suitable for a burst synchronization communication system for communication dividing the timing of the burst synchronization and the timing of the data and/or packets.

The OFDM modulation method is a modulation method applies an inverse Fourier transform to $2^n$ primary modulated (QPSK, 16ASAM, etc.) transmitted signal symbols to form $2^n$ number of sub carriers orthogonal to each other on the frequency axis.

The OFDM modulation signal of the OFDM modulation method is a combined signal of a plurality of modulation waves, so the ratio of the peak amplitude to the mean amplitude is large and the fluctuation in amplitude is large.

Accordingly, when applying the conventional automatic gain control circuit explained above to a communication system with abrupt changes in data such as an OFDM reception signal, in order to suppress an occurrence of the circuit distortion due to the pull-in operation of gain following individual data changes, a time constant of the automatic gain control circuit is prolonged.

For this reason, in the conventional automatic gain control circuit, if the period of the burst synchronization is short, the optimum gain can no longer be pulled into.

As a result of this, there is the disadvantage that the optimum gain is gradually pulled into over several packets, error occurs in the header packet, and deterioration of communication efficiency due to resending of data or the like is induced.

Further, in a system wherein a large number of apparatuses communicate such as in a wireless LAN system, the reception signal levels differ largely according to the transmitted outputs of the individual apparatuses and the distance between apparatuses. Therefore, in an automatic gain control circuit having a long time constant, the optimum gain is not pulled into for the individual packets, but the mean gain of the optimum gains of all packets is pulled into and therefore there is the possibility that the system will end up crashing.

DISCLOSURE OF THE INVENTION

The present invention was made in consideration with such a circumstance and has as an object thereof to provide an automatic gain control circuit able to realize high speed, accurate level acquisition and in turn able to prevent occurrence of error and able to prevent crashing of the system and a method of same and a demodulation apparatus using the same.

To attain the above object, a first aspect of the present invention is an automatic gain control circuit for control of an amplification gain of a reception signal comprised of a data signal to the header part of which is added a burst portion including at least a preamble signal, comprising an automatic gain control amplifier for amplifying an input reception signal level by a gain in accordance with a gain control signal, a reception signal power monitor for detecting a power of the reception signal; a delay unit for delaying the output of the automatic gain control amplifier by a predetermined time; a burst detector for burst detection based on a correlation operation between the output signal of the automatic gain control amplifier and the output signal of the delay unit and outputting a burst synchronization detection signal; and an amplification gain controller for outputting the gain control signal to the automatic gain control amplifier so as to amplify the reception signal with a first gain set in advance when receiving a trigger signal indicating the start of the burst detection, calculating a second gain based on a detected reception signal power value when the reception signal power is detected at the reception signal power monitor, and outputting the gain control signal to the automatic gain control amplifier so as to amplify the reception signal with the second gain, finding the reception signal power value upon receipt of the output signal of the automatic gain control amplifier amplified with the second gain, calculating a third gain based on the found reception signal power value when receiving the burst synchronization detection signal from the burst detector, and outputting the gain control signal to the automatic gain control amplifier so as to amplify the reception signal with the third gain.

Further, a second aspect of the present invention is an automatic gain control circuit for control of an amplification gain of a reception signal comprised of a data signal to the header part of which is added a burst portion including at least a preamble signal and having the preamble signal divided into two stages of a front half section and a rear half section, comprising an automatic gain control amplifier for amplifying an input reception signal level with a gain in accordance with a gain control signal; a reception signal power monitor for detecting a power of the reception signal; a delay unit for delaying the output of the automatic gain control amplifier by a predetermined time; a burst detector for burst detection based on a correlation operation between the output signal of the automatic gain control amplifier and the output signal of the delay unit, outputting a first burst synchronization detection signal when detecting the front half section of the preamble signal, and outputting a second burst synchronization detection signal when detecting the rear half section; and an amplification gain controller for outputting the gain control signal to the automatic gain control amplifier so as to amplify the reception signal with a first gain set in advance when receiving a trigger signal indicating the start of the burst detection, calculating a second gain based on a reception signal power value detected at the reception signal power monitor when receiving the first burst synchronization detection signal by the burst detector, outputting the gain control signal to the automatic gain control amplifier so as to amplify the reception signal with the second gain, finding the reception signal power value upon receipt of the output signal of the automatic gain control amplifier amplified with the second gain, calculating a third gain based on the found reception signal pwer value when receiving the second burst synchronization detection signal by the burst detector, and outputting the gain control signal to the automatic gain control amplifier so as to amplify the reception signal with the third gain.

Further, in the first or second aspect of the present invention, the amplification gain controller fixes the gain of the automatic gain control amplifier at the third gain until the start of the next burst, detection after setting the third gain.

Alternatively, in the first or second aspect of the present invention, the burst signal includes a reference signal subsequent to the preamble signal; the circuit further comprises a timing controller for detecting the reference signal upon receipt of the correlation operation result of the burst detector and outputting the second burst synchronization detection signal to the amplification gain controller; and the amplification gain controller shifts to a waiting mode of the trigger signal when receiving the second burst synchronization detection signal and fixes the gain of the automatic gain control amplifier at the third gain until the input of the next trigger signal.

Alternatively, in the first or second aspect of the present invention, the reception signal power monitor is reset for every start of burst detection and detects the reception signal power after reset.

Alternatively, in the first or second aspect of the present invention, the reception signal power monitor detects the peak value of the reception signal.

Alternatively, in the first or second aspect of the present invention, the reference signal is inserted in the data signal section following the burst portion of the reception signal, and the amplification gain controller finely adjusts the value of the third gain during the reference signal section.

Alternatively, in the first or second aspect of the present invention, the amplification gain controller finds the reception signal power value in the reference signal section and finely adjusts the value of the third gain based on the reception signal power value in the previous reference signal section.

Further, a third aspect of the present invention is an automatic gain control circuit for control of an amplification gain of a reception signal comprised of a data signal to the header part of which is added a burst portion including at least a preamble signal, comprising an automatic gain control amplifier for amplifying an input reception signal level with a gain in accordance with a gain control signal; an analog-to-digital converter for converting an output signal of the automatic gain control amplifier from an analog signal to a digital signal; a reception signal power monitor for detecting a power of the reception signal; a delay unit for delaying the output of the automatic gain control amplifier by a predetermined time; a burst detector for burst detection based on a correlation operation between a digital output signal of the analog-to-digital converter and an output signal of the delay unit and outputting a burst synchronization detection signal; and an amplification gain controller for outputting the gain control signal to the automatic gain control amplifier so as to amplify a reception signal with a first gain set in advance when receiving a trigger signal indicating the start of the burst detection, calculating a second gain based on at least the detected reception signal power value when the reception signal power is detected at the reception signal power monitor, outputting the gain control signal to the automatic gain control amplifier so as to amplify the reception signal with the second gain, receiving the digital output signal of the analog-to-digital converter amplified with the second gain and integrating the same to find the reception signal power value, calculating a third gain based on the found reception signal power value when receiving a burst synchronization detection signal from the burst detector, and outputting the gain control signal to the automatic gain control amplifier so as to amplify the reception signal with the third gain.

Further, a fourth aspect of the present invention is an automatic gain control circuit for control of an amplification gain of a reception signal comprised of a data signal to the header part of which s added a burst portion including at least a preamble signal and having the preamble signal divided into two stages of a front half section and a rear half section, comprising an automatic gain control amplifier for amplifying an input reception signal level with a gain in accordance with a gain control signal; an analog-to-digital converter for converting an output signal of the automatic gain control amplifier from an analog signal to a digital signal; a reception signal power monitor for detecting a power of the reception signal; a delay unit for delaying an output of the automatic gain control amplifier by a predetermined time; a burst detector for burst detection based on a correlation operation between a digital output signal of the analog-to-digital converter and an output signal of the delay unit, outputting a first burst synchronization detection signal when detecting the front half section of the preamble signal, and outputting a second burst synchronization detection signal when detecting the rear half section; and an amplification gain controller for outputting the gain control signal to the automatic gain control amplifier so as to amplify a reception signal with a first gain set in advance when receiving a trigger signal indicating the start of the burst detection, calculating a second gain based on the reception signal power value detected at the reception signal power monitor when receiving the first burst synchronization detection signal from the burst detector, outputting the gain control signal to the automatic gain control amplifier so as to amplify the reception signal with the second gain, receiving the digital output signal of the analog-to-digital converter amplified by the second gain and integrating the same to find the reception signal power value, calculating the third gain based on the found reception signal power value when receiving the second burst synchronization detection signal by the burst detector, and outputting the gain control signal to the automatic gain control amplifier so as to amplify the reception signal by the third gain.

Further, in the third or fourth aspect of the present invention, the amplification gain controller adds the second gain to the reception signal power value from the reception signal power monitor and performs calculations based on a reference signal power value not distorting the analog-to-digital converter.

Alternatively, in the third or fourth aspect of the present invention, the amplification gain controller adds the third gain to the found reception signal power value and performs calculations based on a reference signal power value obtained by optimizing the reception signal power after gain control.

Alternatively, in the third or fourth aspect of the present invention, the amplification gain controller adds the second gain to the reception signal power value from the reception signal power monitor and performs calculations based on a first reference signal power value not distorting the analog-to-digital converter, adds the third gain to the found reception signal power value, and performs calculations based on a second reference signal power value obtained by optimizing the reception signal power after gain control.

Alternatively, in the third or fourth aspect of the present invention, the amplification gain controller fixes the gain of the automatic gain control amplifier at the third gain until the start of the next burst detection after setting the third gain.

Alternatively, in the third or fourth aspect of the present invention, the burst signal includes a reference signal following the preamble signal; the circuit further comprises a timing controller for detecting the reference signal upon receipt of the correlation operation result of the burst detector and outputting the second burst synchronization detection signal to the amplification gain controller; and the amplification gain controller shifts to a waiting mode of the trigger signal when receiving the second burst synchronization detection signal and fixes the gain of the automatic gain control amplifier at the third gain until the input of the next trigger signal.

Alternatively, in the third or fourth aspect of the present invention, the reception signal power monitor is reset for every start of burst detection and detects the reception signal power after reset.

Alternatively, in the third or fourth aspect of the present invention, the reception signal power monitor detects a peak value of the reception signal.

Alternatively, in the third or fourth aspect of the present invention, a reference signal is inserted in the data signal section following the burst portion of the reception signal, and the amplification gain controller finely adjusts the value of the third gain during the reference signal section.

Alternatively, in the third or fourth aspect of the present invention, the amplification gain controller finds the reception signal power value in the reference signal section and finely adjusts the value of the third gain based on the reception signal power value in the previous reference signal section.

Further, a fifth aspect of the present invention is an automatic gain control method for control of an amplification gain of a reception signal comprised of a data signal to the header part of which is added a burst portion including at least a preamble signal, comprising the steps of setting the amplification gain so as to amplify the reception signal with a first gain set in advance when starting the burst detection, amplifying the reception signal with the first gain when the burst detection is started, detecting a power of the reception signal in parallel to this, calculating a second gain based on the detected reception signal power value, setting the amplification gain so as to amplify the reception signal with the second gain, finding the power value of the reception signal amplified with the second gain, performing burst detection based on a correlation operation between the reception signal amplified with the second gain and the delay signal of the reception signal, calculating a third gain based on the reception signal power value amplified with the found second gain when the burst is detected, and setting the amplification gain so as to amplify the reception signal with the third gain.

Further, a sixth aspect of the present invention is an automatic gain control method for control of an amplification gain of a reception signal comprised of a data signal to the header part of which is added a burst portion including at least a preamble signal and having the preamble signal divided into two stages of a front half section and a rear half section, comprising the steps of setting the amplification gain so as to amplify the reception signal with a first gain set in advance when starting the burst detection, amplifying the reception signal with the first gain when the burst detection is started, detecting a power of the reception signal in parallel to this, performing burst detection of the front half section of the preamble signal based on a correlation operation between the reception signal amplified with the first gain and the delay signal of the reception signal, calculating a second gain based on the detected reception signal power value when a burst in the front half section is detected, setting the amplification gain so as to amplify the reception signal with the second gain, finding the power value of the reception signal amplified with the second gain, performing burst detection of the rear half section of the preamble signal based on a correlation operation between the reception signal amplified with the second gain and the delay signal of the reception signal, calculating a third gain based on the reception signal power value amplified with the found second gain when a burst in the rear half section is detected, and setting the amplification gain so as to amplify the reception signal with the third gain.

Further, in the fifth or sixth aspect of the present invention, the method further comprises, after setting the third gain, fixing the amplification gain to the third gain until the start of the next burst detection.

Alternatively, in the fifth or sixth aspect of the present invention, the burst signal includes a reference signal following the preamble signal and the method further comprises detecting the reference signal upon receipt of the correlation operation result at the time of the burst detection, shifting to a waiting mode of a burst detection start instruction when the reference signal is detected, and fixing the amplification gain at the third gain until receiving the next burst detection start instruction.

Alternatively, in the fifth or sixth aspect of the present invention, a reference signal is inserted in the data signal section following the burst portion of the reception signal, and the method further comprises finely adjusting the third gain during the reference signal section.

Alternatively, in the fifth or sixth aspect of the present invention, the method further comprises finding the reception signal power value in the reference signal section and finely adjusting the value of the third gain based on the reception signal power value in the previous reference signal section.

Further, a seventh aspect of the present invention is a demodulation apparatus for control of an amplification gain of a reception signal comprised of a data signal to the header part of which is added a burst portion including at least a preamble signal and demodulating the reception signal after amplification, including an automatic gain control circuit having an automatic gain control amplifier for amplifying an input reception signal level with a gain in accordance with a gain control signal; a reception signal power monitor for detecting a power of the reception signal; a delay unit for delaying an output of the automatic gain control amplifier by a predetermined time; a burst detector for burst detection based on a correlation operation between an output signal of the automatic gain control amplifier and an output signal of the delay unit and outputting a burst synchronization detection signal; and an amplification gain controller for outputting the gain control signal to the automatic gain control amplifier so as to amplify the reception signal with a first gain set in advance when receiving a trigger signal indicating the start of the burst detection, calculating a second gain based on a detected reception signal power value when the reception signal power is detected at the reception signal power monitor, outputting the gain control signal to the automatic gain control amplifier so as to amplify the reception signal with the second gain, finding the reception signal power value upon receipt of the output signal of the automatic gain control amplifier amplified with the second gain, calculating a third gain based on the found reception signal power value when receiving a burst synchronization detection signal from the burst detector, and outputting the gain control signal to the automatic gain control amplifier so as to amplify the reception signal with the third gain.

Further, an eighth aspect of the present invention is a demodulation apparatus for control of an amplification gain of a reception signal comprised of a data signal to the header part of which is added a burst portion including at least a preamble signal and having the preamble signal divided into two stages of a front half section and a rear half section and demodulating the reception signal after amplification, including an automatic gain control circuit having an automatic gain control amplifier for amplifying the input reception signal level with a gain in accordance with a gain control signal; a reception signal power monitor for detecting a power of the reception signal; a delay unit for delaying an output of the automatic gain control amplifier by a predetermined time; a burst detector for burst detection based on a correlation operation between an output signal of the automatic gain control amplifier and an output signal of the delay unit, outputting a first burst synchronization detection signal when detecting the front half section of the preamble signal, and outputting a second burst synchronization detection signal when detecting the rear half section; and an amplification gain controller for outputting the gain control signal to the automatic gain control amplifier so as to amplify the reception signal with a first gain set in advance when receiving a trigger signal indicating the start of the burst detection, calculating a second gain based on the reception signal power value detected at the reception signal power monitor when receiving the first burst synchronization detection signal from the burst detector, outputting the gain control signal to the automatic gain control amplifier so as to amplify the reception signal with the second gain, finding the reception signal power value upon receipt of the output signal of the automatic gain control amplifier amplified with the second gain, calculating a third gain based on the found reception signal power value when receiving the second burst synchronization detection signal by the burst detector, and outputting the gain control signal to the automatic gain control amplifier so as to amplify the reception signal with the third gain.

Further, a ninth aspect of the present invention is a demodulation apparatus for control of an amplification gain of a reception signal comprised of a data signal to the header part of which is added a burst portion including at least a preamble signal and demodulating the reception signal after amplification, including an automatic gain control circuit having an automatic gain control amplifier for amplifying an input reception signal level with a gain in accordance with a gain control signal; an analog-to-digital converter for converting an output signal of the automatic gain control amplifier from an analog signal to a digital signal; a reception signal power monitor for detecting a power of the reception signal; a delay unit for delaying the output of the automatic gain control amplifier by a predetermined time; a burst detector for burst detection based on a correlation operation between a digital output signal of the analog-to-digital converter and an output signal of the delay unit and outputting a burst synchronization detection signal; and an amplification gain controller for outputting the gain control signal to the automatic gain control amplifier so as to amplify the reception signal with a first gain set in advance when receiving the trigger signal indicating the start of the burst detection, calculating a second gain based on at least the detected reception signal power value when the reception signal power is detected at the reception signal power monitor, and outputting the gain control signal to the automatic gain control amplifier so as to amplify the reception signal with the second gain, receiving the digital output signal of the analog-to-digital converter amplified with the second gain and integrating the same to find the reception signal power value, calculating a third gain based on the found reception signal power value when receiving the burst synchronization detection signal from the burst detector, and outputting the gain control signal to the automatic gain control amplifier so as to amplify the reception signal with the third gain.

Further, a 10th aspect of the present invention is a demodulation apparatus for control of an amplification gain of a reception signal comprised of a data signal to the header part of which is added a burst portion including at least a preamble signal and having the preamble signal divided into two stages of a front half section and a rear half section and demodulating the reception signal after amplification, including an automatic gain control circuit having an automatic gain control amplifier for amplifying an input reception signal level with a gain in accordance with a gain control signal; an analog-to-digital converter for converting the output signal of the automatic gain control amplifier from an analog signal to a digital signal; a reception signal power monitor for detecting a power of the reception signal; a delay unit for delaying the output of the automatic gain control amplifier by a predetermined time; a burst detector for burst detection based on a correlation operation between a digital output signal of the analog-to-digital converter and an output signal of the delay unit, outputting a first burst synchronization detection signal when detecting the front half section of the preamble signal, and outputting a second burst synchronization detection signal when detecting the rear half section; and an amplification gain controller for outputting the gain control signal to the automatic gain control amplifier so as to amplify the reception signal with a first gain set in advance when receiving a trigger signal indicating the start of the burst detection, calculating a second gain based on the reception signal power value detected at the reception signal power monitor when receiving the first burst synchronization detection signal from the burst detector, outputting the gain control signal to the automatic gain control amplifier so as to amplify the reception signal with the second gain, receiving the digital output signal of the analog-to-digital converter amplified with the second gain and integrating the same to find the reception signal power value, calculating a third gain based on the found reception signal power value when receiving the second burst synchronization detection signal from the burst detector, and outputting the gain control signal to the automatic gain control amplifier so as to amplify the reception signal with the third gain.

Further, in the seventh, eighth, ninth, or 10th aspect of the present invention, the reception signal is modulated based on an orthogonal frequency division multiplexed modulation method.

According to the present invention, at the start of the burst detection, the gain control signal is output to the automatic gain control amplifier from the amplification gain controller, and the amplification gain of the automatic gain control amplifier is set at a value set in advance, for example, the first gain of the maximum value.

In this state, a state waiting for input of the reception signal is entered

In such a state, first, the preamble signal at the header of the reception signal is input to the automatic gain control amplifier.

The automatic gain control amplifier, for example, amplifies the front half section of the preamble signal of the reception signal with the first gain (maximum gain) and outputs the result to for example the A/D converter.

In parallel to this, the preamble signal of the reception signal is input to the reception signal power monitor. The reception signal power monitor monitors the power of the reception signal, measures for example the peak voltage, and supplies a reception signal power value taking a value in accordance with the input reception signal level to the amplification gain controller.

The A/D converter converts the preamble signal portion of the reception signal from an analog signal to a digital signal and supplies it to the amplification gain controller, delay unit, and burst detector.

At this time, the output signal of the A/D converter ends up being distorted, but since it is not a data signal, deterioration of the quality of the reception signal is not caused.

The delay unit delays the digital reception signal by the amount of the burst period for burst detection and outputs the result to the burst detector.

The burst detector performs a correlation (auto-correlation and cross-correlation) operation between the digital reception signal from the A/D converter and the delay signal from the delay unit.

Then, based on for example the auto-correlation result, it detects a burst signal of a period determined by the communication system, first generates a first synchronization detection signal indicating that the front half X section of the preamble signal is detected, and outputs the same to the amplification gain controller.

Note that, even if the preamble signal is distorted, since the burst detector uses an auto-correlation circuit, burst detection is possible without lowering the detection rate.

The amplification gain controller receives the first burst synchronization detection signal from the burst detector, calculates the gain based on the reception signal power value detected at the reception signal monitor and a suitable value not distorting the A/D converter, and sets the gain control signal at the calculated value.

This gain control signal is supplied to the automatic gain control amplifier. The automatic gain control amplifier receives the gain control signal and sets the gain at the second gain as the calculated value.

Note that, at this time, the gain of the automatic gain control amplifier includes analog signal processing in the step of calculation of the peak value of the reception signal power, includes slight variation, and is therefore rough gain control.

The automatic gain control amplifier amplifies for example the remaining front half section and rear half section of the preamble signal of the reception signal with the gain in accordance with the reception signal level and outputs the result to the A/D converter.

The A/D converter converts the preamble signal portion of the reception signal from an analog signal to a digital signal and supplies it to the amplification gain controller, delay unit, and burst detector.

At this time, the input signal of the A/D converter is amplified with a gain based on a suitable value not distorting the A/D converter, so distortion does not occur in the output signal of the A/D converter.

The delay unit delays the digital reception signal by the amount of the burst period for the burst detection and outputs the result to the burst detector.

The burst detector performs the correlation (auto-correlation and cross-correlation) operation between the digital reception signal from the A/D converter and the delay signal from the delay unit.

Then, based on for example the auto-correlation result, it detects the burst signal of the period determined by the communication system, generates a second synchronization detection signal indicating that the front half X section of the preamble signal is detected, and outputs it to the amplification gain controller.

The amplification gain controller receives the signal passed through the A/D converter without distortion by a gain based on the reception signal power, integrates for example the digital value of the reception signal, and measures the correct signal power value.

Further, the amplification gain controller receives the second burst synchronization detection signal from the burst detector, calculates the gain based on the digital integrated value of the reception signal passed through the A/D converter without distortion and the optimum value not distorting the A/D converter, and sets the gain control signal at the calculated value.

This gain control signal is supplied to the automatic gain control amplifier. The automatic gain control amplifier receives the gain control signal and sets the gain at the third gain as the optimum calculated value.

The automatic gain control amplifier amplifies the Y section of the remaining rear half of the preamble signal and the reference signal and data signal of the reception signal with a gain in accordance with the reception signal level and outputs the result to the A/D converter.

The A/D converter converts the reference signal and data portion of the reception signal from an analog signal to a digital signal and supplies them to the amplification gain controller, delay unit, and burst detector.

At this time, since the input signal of the A/D converter is amplified with a gain based on an optimum value not distorting the A/D converter, distortion is not generated in the output signal of the A/D converter.

The delay unit delays the digital reception signal by the amount of the burst period for the burst detection and output the result to the burst detector.

The burst detector performs the correlation (auto-correlation and cross-correlation) operation between the digital reception signal from the A/D converter and the delay signal from the delay unit.

Then, for example, for example, it supplies the cross-correlation power of the cross-correlation result to the timing controller, monitors the peak timing based on the power, and outputs the third synchronization detection signal to the amplification gain controller after a predetermined time from this peak timing.

The amplification gain controller receiving the third synchronization detection signal returns to the initial mode, that is, the waiting mode of the trigger signal.

After this, the optimized gain value is fixed until the data signal is terminated after that and the next burst detection starts.

BRIEF DESCRIPTION OF THE DRAWINGS

FIGS. 20A to 20H are views showing timing charts for explaining the operation of the amplification gain controller of FIG. 19.

BEST MODE FOR WORKING THE INVENTION

Figure 1:
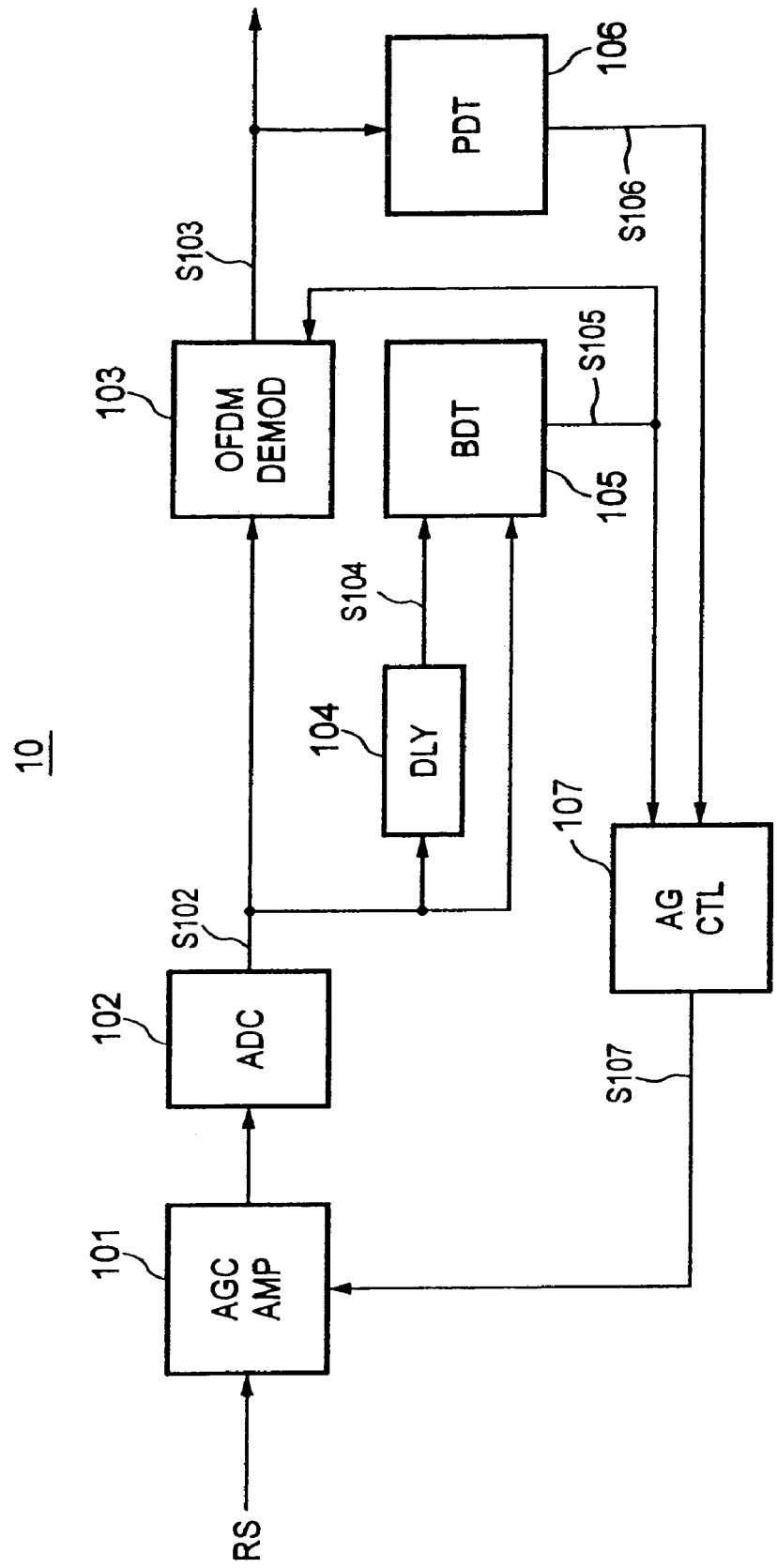
FIG. 1 is a block diagram of an example of the configuration of a demodulation apparatus mounting a conventional AGC circuit able to be applied to a wireless communication system using a burst synchronization.
Figure 2:
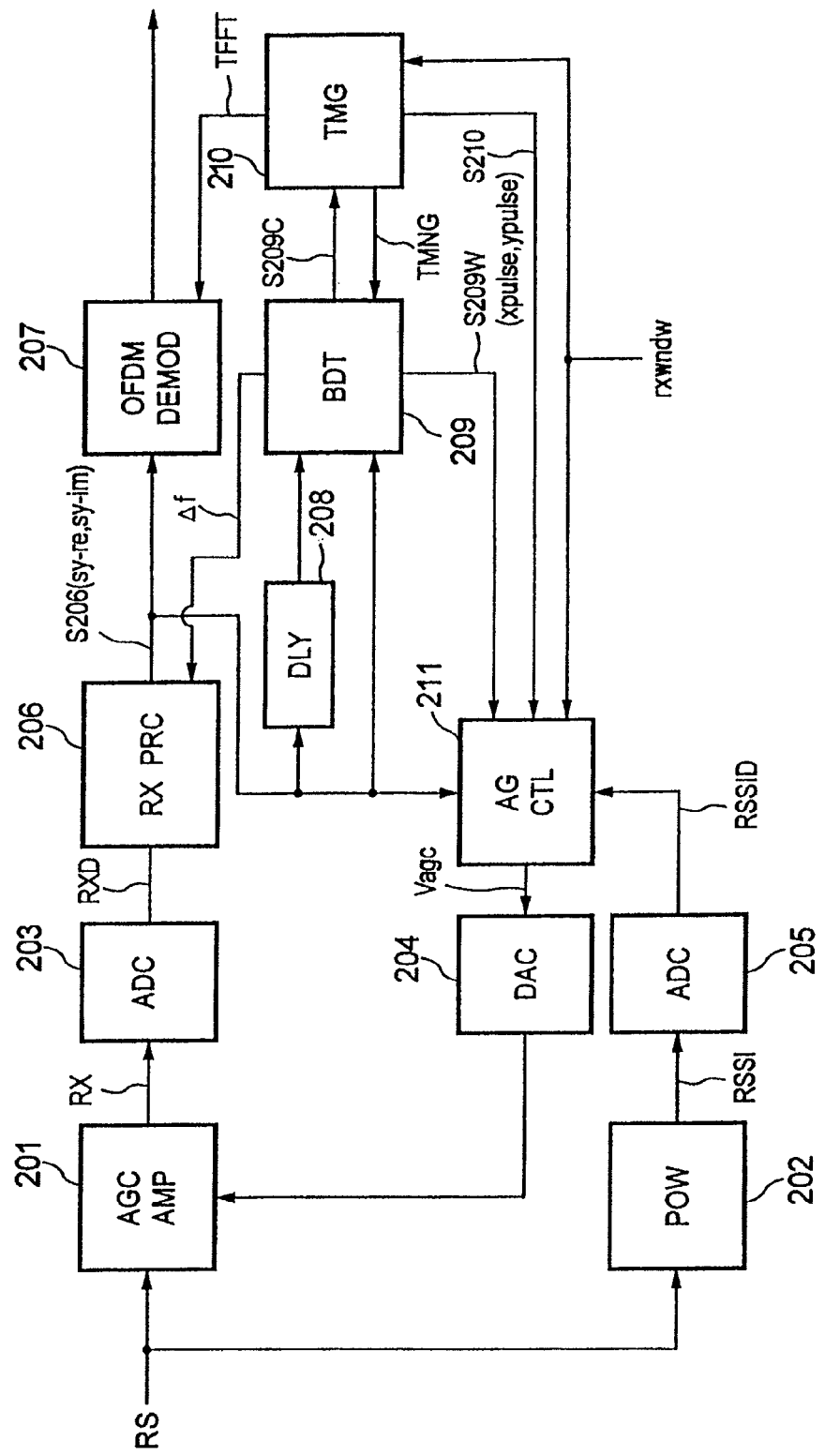
FIG. 2 is a block diagram of the configuration of an embodiment of a burst synchronization demodulation apparatus to which an automatic gain control circuit according to the present invention is applied.

FIG. 2 is a block diagram of the configuration of an embodiment of a burst synchronization demodulation apparatus to which an automatic gain control circuit according to the present invention is applied.

The burst synchronization demodulation apparatus 20 has, as shown in FIG. 2, an automatic gain control amplifier (AGCAMP) 201, reception signal power monitor (POW) 202, A/D converter (ADC) 203, digital-to-analog analog (D/A) converter (DAC) 204, A/D converter (ADC) 205, reception signal processing unit (RXPRC) 206, OFDM demodulator (DEMOD) 207, delay unit (DLY) 208, burst detector (BDT) 209, timing controller (TMG) 210, and amplification gain controller (AGCTL) 211 as main components.

Below, the reason why the automatic gain control circuit according to the present invention is required for the burst synchronization communication system employed in the present embodiment, the transmission (reception) signal, and concrete configurations and functions of the components of the burst demodulation apparatus 20 of FIG. 2 will be sequentially explained.

In the present embodiment, as an example of the burst synchronization communication system, an explanation will be given of the automatic gain control system of a burst synchronization demodulation apparatus of a 5 GHz band wireless LAN system.

The 5 GHz band wireless LAN system employs the OFDM modulation method for realizing excellent communication performance over a broad band.

The OFDM modulation method is large in strength against ghosts and multi-paths, but in contrast is weak in strength against nonlinearity of the circuit.

For this reason, when distortion of the A/D converter etc. occurs, a remarkable deterioration of the reception signal quality is induced.

For this reason, in the 5 GHz band wireless LAN system, it is necessary to insert a burst signal of 10 to 20 microseconds referred to as a "preamble signal" into the header of the modulation signal, take the timing synchronization in this section, on the one hand to perform level acquisition of the voltage amplitude of the signal input to the A/D converter 203 within a signal tolerance range where distortion does not occur.

Further, the several microseconds of the rear half of the preamble signal include a reference signal for monitoring the frequency characteristic of a channel and correcting a data signal following the preamble signal (actual communication data). In the reference signal and the data signal, fluctuation of the level of the digital signal output from the A/D converter 203 is not permitted. It is necessary to hold the gain of the automatic gain control amplifier 201 constant.

Accordingly, in the 5 GHz band wireless LAN system, a high speed and high performance automatic gain amplification method for performing level acquisition within the signal tolerance range where distortion does not occur for a time of 10 microseconds becomes necessary.

In the present embodiment, as will be explained later, in order to realize the high speed and high performance level acquisition to be performed in the preamble section, a three step level acquisition is carried out.

As the 5 GHz band wireless LAN system, there are the following three representative systems:

<1> IEEE 802.11a,
<2> BRAN, and
<3> Wireless 1394.

Figure 3:
FIG. 3 is a view showing a burst signal portion including a representative preamble signal of an IEEE 802.11a system.
Figure 4:
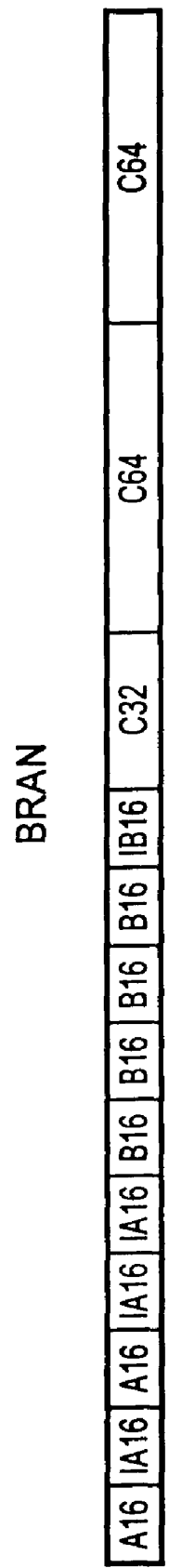
FIG. 4 is a view showing a burst signal portion including a representative preamble signal of a BRAN system.

FIG. 3 is a view showing a burst signal portion including the representative preamble signal of the IEEE 802.11a system; FIG. 4 is a view showing a burst signal portion including a representative preamble signal of the BRAN system; and FIG. 5 is a view showing a burst signal portion including a representative preamble signal of the Wireless 1394 system.

Figure 5:
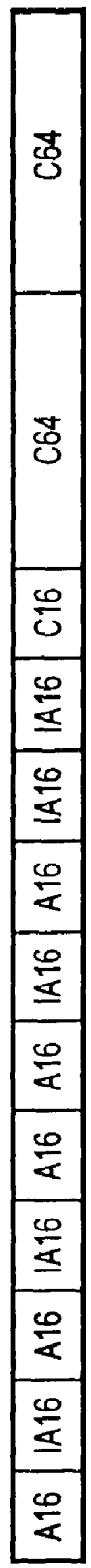
FIG. 5 is a view showing a burst signal portion including a representative preamble signal of a Wireless 1394 system.

In the preamble signals of the systems shown in FIG. 3 to FIG. 5, A16, B16, etc. represent the pattern identification and the burst period, while IA16 represents the pattern of the A16 phase inverted.

Further, C64 represents the reference signal, while C16 and C32 indicate guard interval portions.

In the IEEE 802.11a, the pattern B16 is repeated 10 times. As opposed to this, in the BRAN, the first 5 periods are different (A16, IA16, A16, IA16, A16, IA16).

Further, in the Wireless 1394, all of the 10 periods are different patterns. Concretely, they become patterns of A16, IA16, A16, IA16, A16, IA16, A16, IA16, A16, IA16.

Further, in the Wireless 1394 system, a synchronous transfer mode is supported, so a continuous signal such as a video signal can be communicated.

However, when a data signal extending over a long period is communicated, the transmission characteristic changes from the transmission characteristic at the time of the reception of the reference signal in the preamble signal at the header of the reception signal under the multi-path environment, and the reception performance ends up deteriorating.

Figure 6:
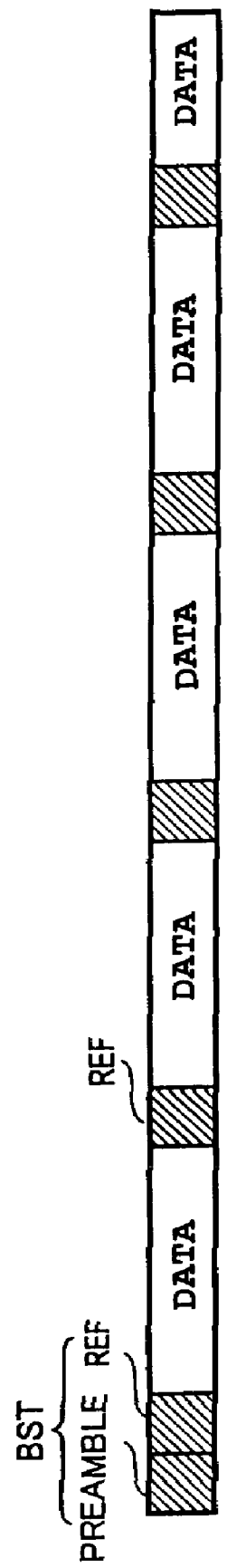
FIG. 6 is a view showing a signal format wherein a reference signal REF is inserted in a data signal section of a constant period or more in the Wireless 1394 system.

For this reason, the data signal section of the constant period or more, as shown in FIG. 6, has a reference signal REF inserted in it. Due to this, the transmission characteristic is measured again for every reference signal, and deterioration of the reception performance is prevented.

The components of the demodulation apparatus for demodulating the reception signal when a burst signal portion including a signal of 10 to 20 microseconds referred to as a "preamble signal" is inserted in the header of the modulation signal as described above have the following configurations and functions.

The automatic gain control amplifier 201 automatically controls the gain of the reception signal RS received at a not illustrated antenna based on the level of a gain control signal Vagc from the amplification gain controller 211 supplied via the DAC 204 and outputs the signal RX of the intended level to the A/D converter 203. Note that, the automatic gain control amplifier 201 is controlled between the case of automatic gain control by the gain control signal Vagc from the amplification gain controller 211 and the case of fixing the control gain.

Figure 7:
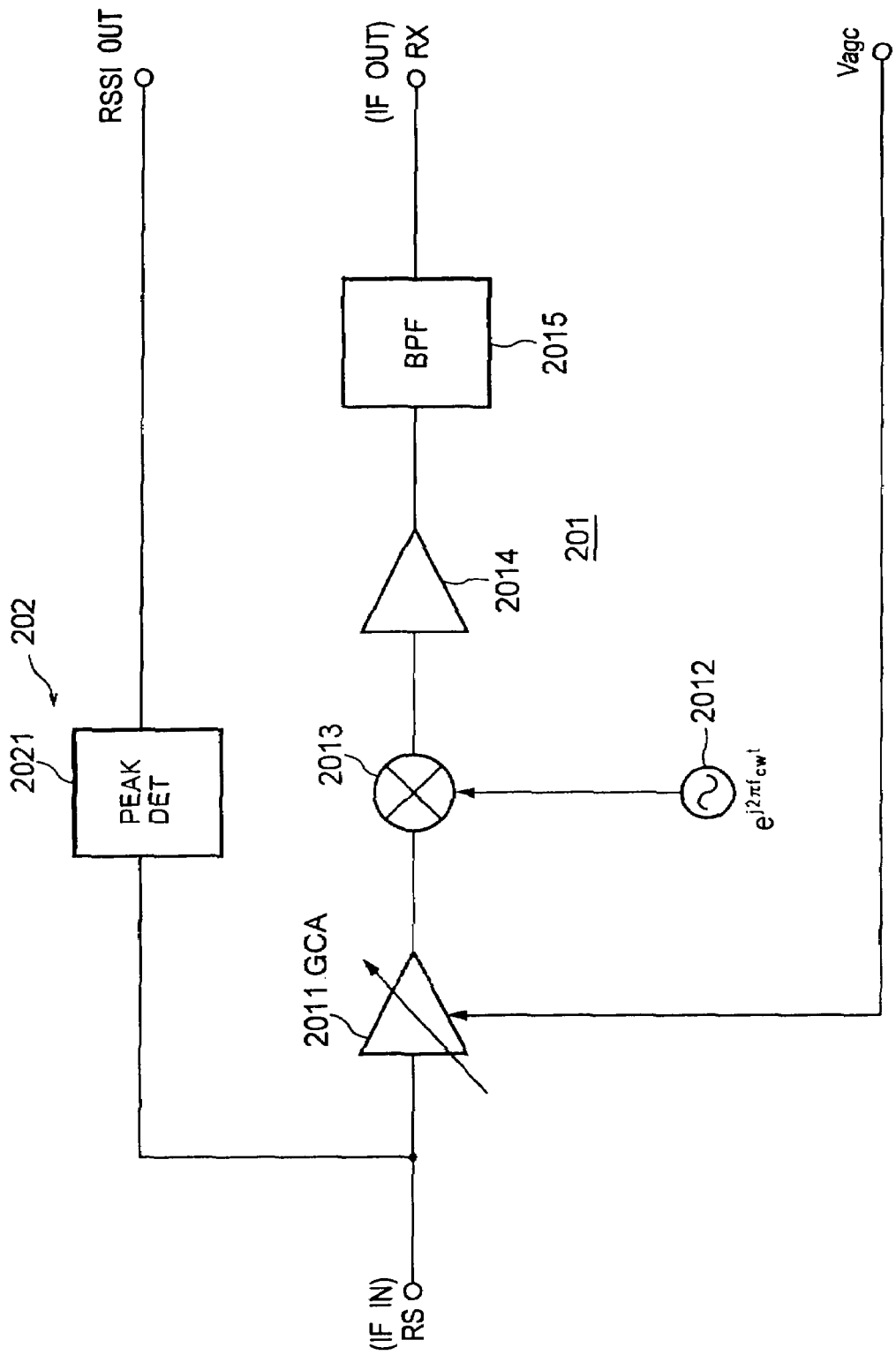
FIG. 7 is a circuit diagram showing a concrete configuration of an automatic gain control amplifier of FIG. 2.

FIG. 7 is a circuit diagram showing a concrete configuration of the automatic gain control amplifier 201.

The automatic gain control amplifier 201 has, as shown in FIG. 7, a gain control amplifier (GCA) 2011, local oscillator 2012, multiplier 2013, amplifier 2014, and band pass filter (BPF) 2015 having a band width of several tens MHz.

A frequency conversion circuit is configured by the local oscillator 2012 and the multiplier 2013 among these components. The local oscillator 2012 outputs for example a signal $e[j2\pi f_{cw}t]$ of the carrier frequency $f_{cw}$ to the multiplier 2013. Note, the [ ] indicates the power of e.

In the automatic gain control amplifier 201 of FIG. 7, the gain control amplifier 2011 amplifies the reception signal (IF input signal) RS with the gain determined by the gain control signal Vagc, the amplified signal is converted in frequency by the frequency conversion circuit comprised of the local oscillator 2012 and the multiplier 2013, and then the BPF 2015 restricts the band to obtain the output signal (IF output) RX.

Figure 8:
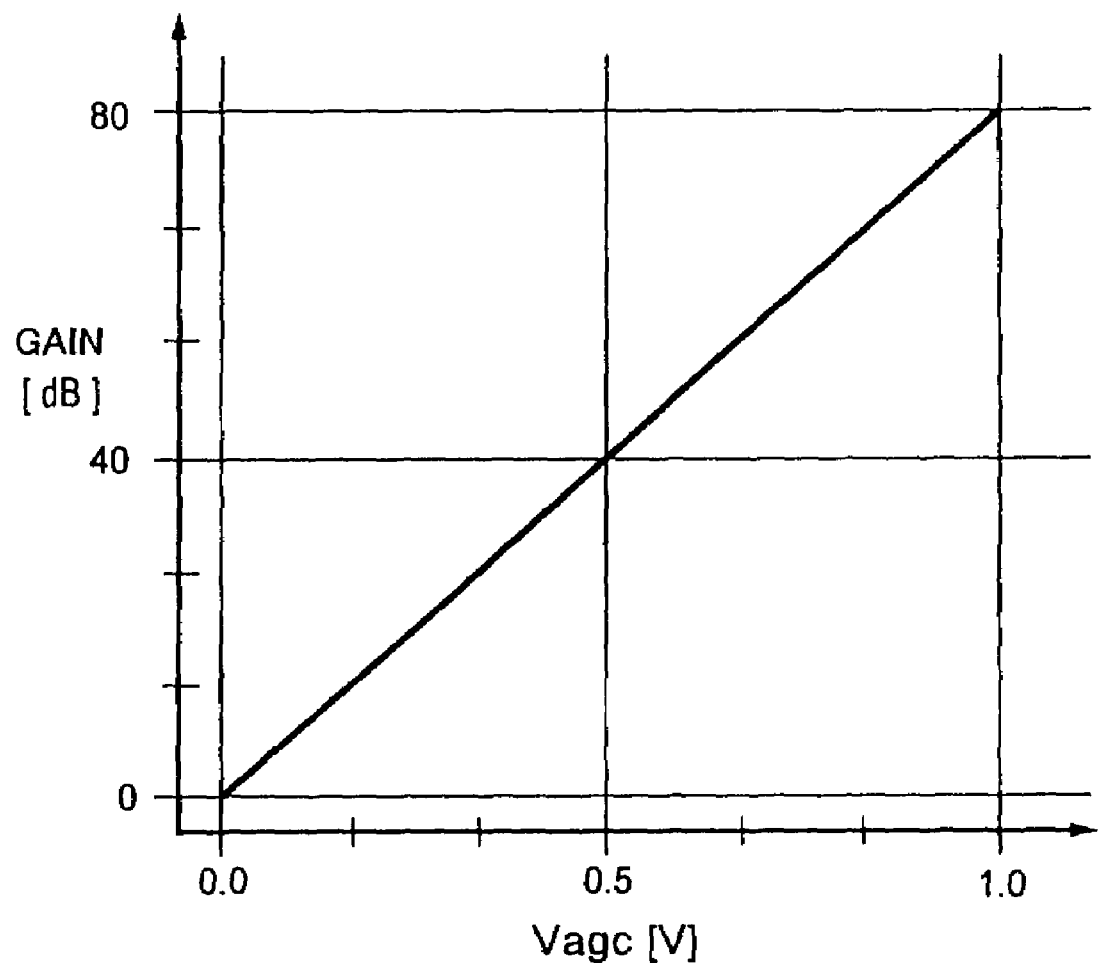
FIG. 8 is a view showing an example of a gain control characteristic of the gain control amplifier of FIG. 7.

Further, FIG. 8 is a view showing the gain control characteristic of the gain control amplifier 2011 of FIG. 7.

In FIG. 8, the abscissa indicates the gain control signal Vagc, and the ordinate indicates the gain.

In this example, as shown in FIG. 8, the gain control amplifier 2011 linearly changes the gain from 0 to 80 dB within a range where the gain control signal Vagc is 0V to 1V.

Namely, in this example, the control gain range is 80 dB.

The reception signal power monitor 202 includes a peak detection circuit (Peak Det) 2021 as the peak value detection circuit as shown in FIG. 7, measures the peak voltage of the reception signal RS, converts it to a field strength signal RSSI of a voltage signal taking a value in accordance with the input reception signal level, and outputs the same to the A/D converter 205.

Here, in order to deal with abrupt signal changes, the monitor detects not the mean value, but the peak value. Note that, it gives a reset signal at the time of start of the burst detection, resets the peak detection circuit (Peak Det) 2021, and monitors the maximum peak value after that.

Figure 9:
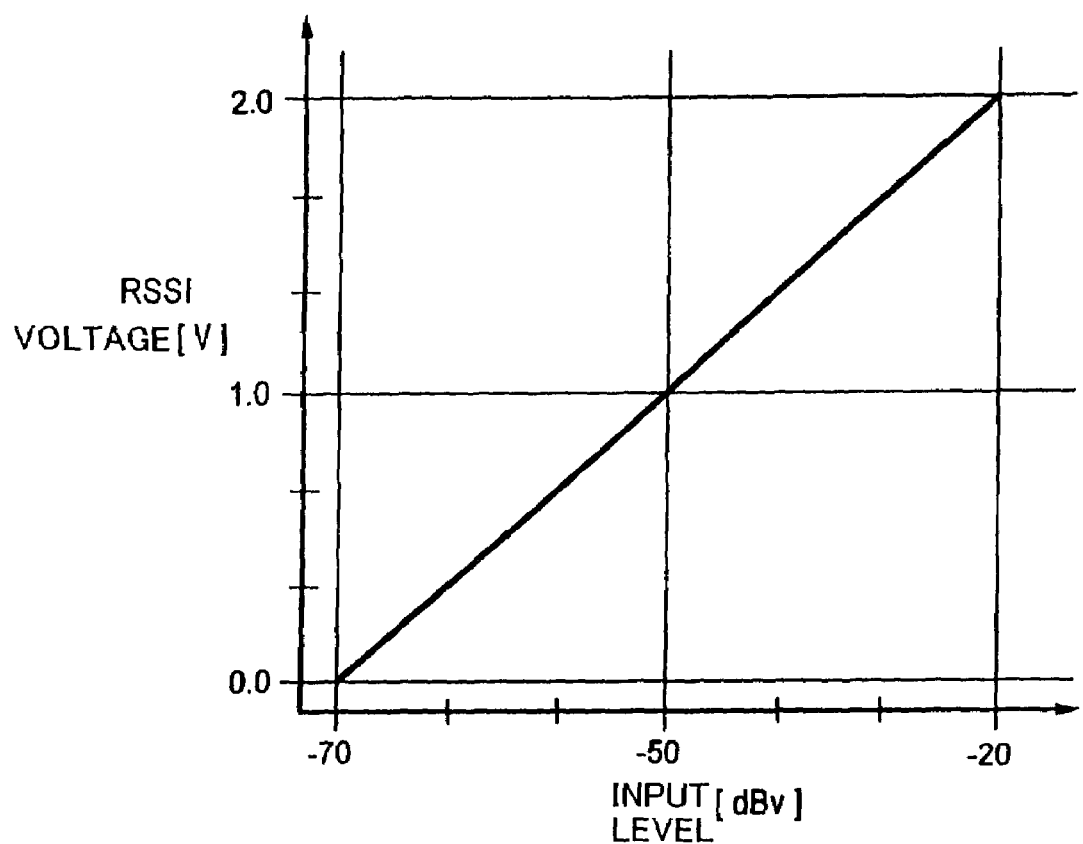
FIG. 9 is a view showing an output characteristic of a reception signal power monitor for the input level of the reception signal.

FIG. 9 is a view showing the output characteristic of the reception signal power monitor 202 for the input level of the reception signal.

In FIG. 9, the abscissa indicates the input level, and the ordinate indicates the voltage of the field strength signal RRSI.

In this example, as shown in FIG. 9, the voltage of the field strength signal RSSI linearly changes from 0V to 2V within the range where the input level is −70 dBv to −20 dBv.

The A/D converter 203 converts the analog reception signal RX output from the automatic gain control amplifier 201 to a digital signal and outputs the same as the digital reception signal RXD to the reception signal processing unit 206.

The D/A converter 204 converts the gain control signal Vagc generated at the amplification gain controller 211 from a digital signal to an analog signal and outputs the same to the automatic gain control amplifier 201.

The A/D converter 205 converts the field strength signal RSSI output from the reception signal power monitor 202 from the analog signal to a digital signal and outputs it to the amplification gain controller 211.

The reception signal processing unit 206 converts the digital reception signal RXD to baseband signals bb_re (real portion) and bb_im (imaginary portion), converts the sampling frequency of the baseband signal to a low frequency (performs down sampling), performs complex multiplication based on an error detection frequency Δf by the burst detector 209 to correct the frequency offset, generates the signal S206 (sy_re and sy_im), and outputs the same to the OFDM demodulator 207, delay unit 208, burst detector 209, and amplification gain controller 211.

Figure 10:
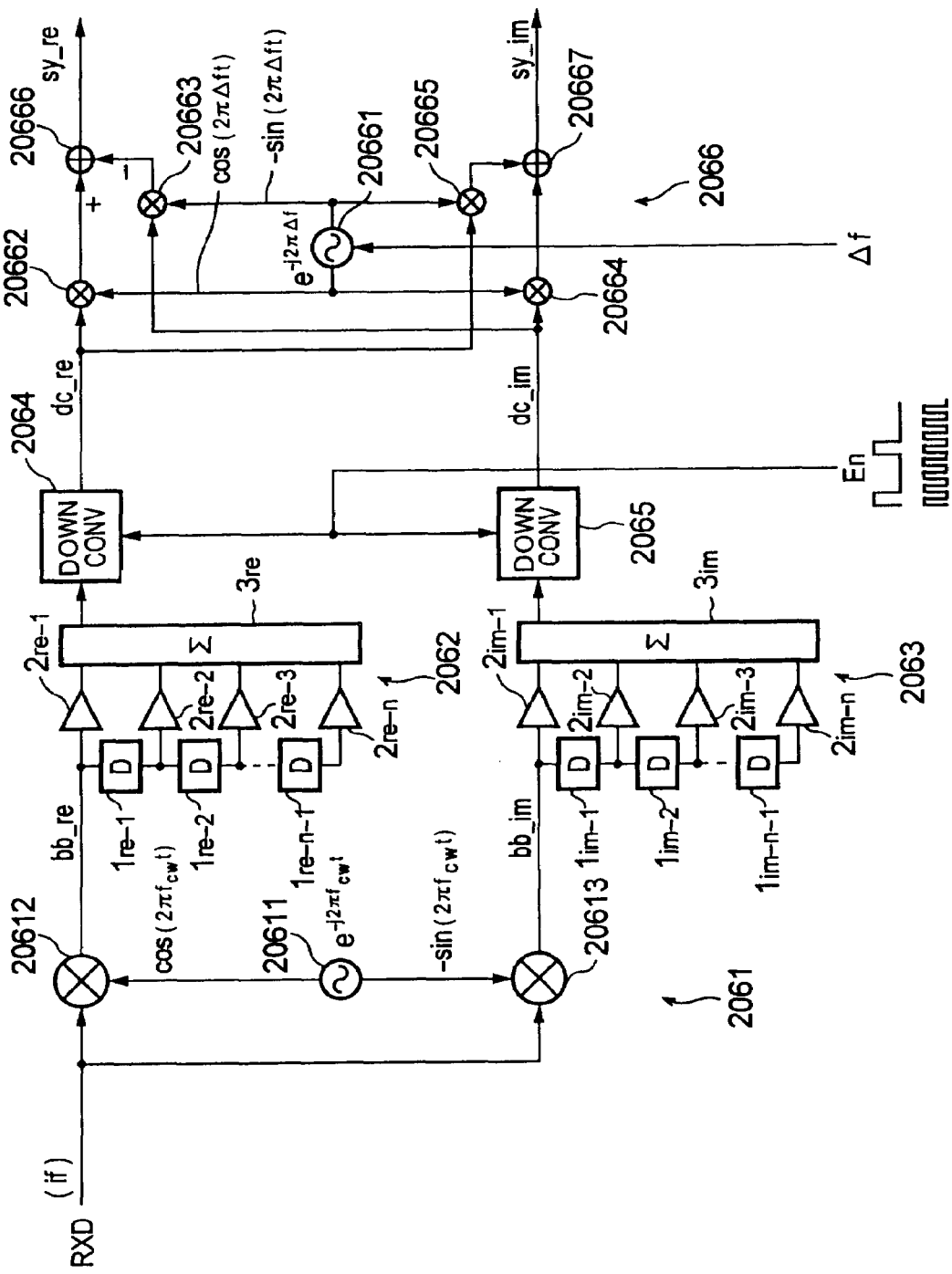
FIG. 10 is a circuit diagram showing a concrete example of the configuration of a reception signal processing unit of FIG. 2.

FIG. 10 is a circuit diagram showing a concrete example of the configuration of the reception signal processing unit 206 of FIG. 2.

The present reception signal processing unit 206 is configured by, as shown in FIG. 10, a baseband conversion circuit 2061, digital low pass filters (LPF) 2062 and 2063, down convert circuits 2064 and 2065, and a frequency offset correction circuit 2066.

The baseband conversion circuit 2061 is configured by a local oscillator 20611 and multipliers 20612 and 20613.

The baseband conversion circuit 2061 multiplies the reception signal RXD (if) by the carrier frequency $f_{cw}$ at the multipliers 20612 and 20613 to convert the input reception signal RXD (if) to the baseband signals bb_re and bb_im as shown in Equation (1) and supplies the results to the LPF 2062 and 2063.

$$bb\_re = if \times \cos(2\pi f_{cw} t)$$
$$bb\_im = if \times \sin(2\pi f_{cw} t) \quad (1)$$

The LPF 2062 and 2063 have for example linear phase FIR (finite impulse response) transversal type circuit configurations.

The LPF 2062 is configured by (n−1) number of delay units 1re−1 to 1re−n−1 cascade connected with the input line of the baseband signal bb_re and configuring a shift register, n number of multipliers 2re−1 to 2re−n for multiplying the input baseband signal bb_re and the output signals of the delay units 1re−1 to 1re−n−1 with filter coefficients h(0) to h(n−1), and an adder 3re for adding the output signals of the n number of multipliers 2re−1 to 2re−n and outputting the result to the down convert circuit 2064.

The LPF 2063 is configured by (n−1) number of delay units 1im−1 to 1im−n−1 cascade connected with the input line of the baseband signal bb_im and configuring a shift register, n number of multipliers 2im−1 to 2im−n for multiplying the input baseband signal bb_im and the output signals of the delay units 1im−1 to 1im−n−1 with the filter coefficients h(0) to h(n−1), and an adder 3im for adding the output signals of the n number multipliers 2im−1 to 2im−n and outputting the result to the down convert circuit 2064.

These LPFs 2062 and 2063 and down convert circuits 2064 and 2065 convert the sampling frequencies of the baseband signals bb_re and bb_im to a signal dc_re from for example 100 MHz to 25 MHz.

At this time, the LPFs 2062 and 2063 restrict the bands of the baseband signals bb_re and bb_im and prevents adjacent carriers from being aliased.

Further, the timing of the down sampling at the down convert circuits 2064 and 2065 thins out the clock upon receipt of the supply of a signal En.

The frequency offset correction circuit 2066 is configured by a local oscillator 20661, multipliers 20662 to 20665, and adders 20666 and 20667.

The frequency offset correction circuit 2066 reflects the error detection frequency Δf given from the burst detector 209 in the oscillation output of the local oscillator 20661, complex multiplies this oscillation output and the signal dc_re at the multipliers 20662 and 20665, complex multiplies the oscillation output and the signal dc_im at the multipliers 20663 and 20664, adds the outputs of the multiplier 20662 and the multiplier 20663 at the adder 20666, and adds the outputs of the multiplier 20664 and the multiplier 20665 at the adder 20667 thereby to generate the signals sy_re and sy_im as shown in the following Equations (2) and (3) and outputs the same to the OFDM demodulator 207, delay unit 208, burst detector 209, and amplification gain controller 211.

$$sy\_re = dc\_re \times \cos(2\pi f_{cw} t) + dc\_im \times \sin(2\pi f_{cw} t) \quad (2)$$

$$sy\_im = dc\_im \times \cos(2\pi f_{cw} t) - dc\_re \times \sin(2\pi f_{cw} t) \quad (3)$$

The OFDM demodulator 207 processes the output signal S206 of the reception signal processing unit 206, that is, the signals sy_re and y_im, by a fast discrete Fourier transform in synchronization with the FFT timing signal TFFT supplied from the timing controller 210 to demodulate the OFDM signal and outputs the result to the next processing circuit.

The delay unit 208 delays the output signal S206 of the reception signal processing unit 206, that is, the signals sy_re and sy_im, by the amount of the burst period for the burst detection and outputs the result as the signal S208 to the burst detector 209.

Note that burst detection of the IEEE 802.11a system uses a delay of the delay unit 208 of 16 clocks to detect a burst of 16 clock periods.

The burst detection of the BRAN system uses a delay of the delay unit 208 of 32 clocks to detect a burst of an amount of the front half 5 periods. By making the delay of the delay unit 208 16 clocks, it can detect a burst of the rear half 5 periods, but two delaying means having different delays would be required.

The burst detection of the Wireless 1394 system can make the delay of the delay unit 208 32 clocks to detect a burst of the amount of the front half 5 periods and also can detect a burst of the amount of the rear half 5 periods with the same delay.

The burst detector 209 finds the correlation between the signal S206 (sy_re and sy_im) from the reception signal processing unit 206 and the delay signal S208 from the delay unit 208, detects the burst signal of the period determined by the communication system, detects the parameters concerning the packet and frame structure, generates first and second synchronization detection signals S209W (xpulse, ypulse) as the synchronization timing window signals in synchronization with timing signals TMNG (X, Y, C) by the timing controller 210, and outputs the same to the amplification gain controller 211.

Further, the burst detector 209 outputs the predetermined correlation result and a valid signal S209C serving as a reference of the timing signal output to the timing controller 210.

Further, the burst detector 209 calculates the error frequency from the phase difference between the real portion and the imaginary portion of the reception signal based on the correlation result to generate the error detection frequency Δf and outputs the same to the reception signal processing unit 206.

The timing controller 210 outputs the timing signals TMNG (X, Y, C) for generating the first and second synchronization detection signals S209W (xpulse, ypulse) from the burst detector 209 to the burst detector 209 triggered by a trigger signal rxwndw.

Further, the timing controller 210 monitors the peak timing from the correlation result from the burst detector 209, outputs a third synchronization detection signal S210 (cpulse) to the amplification gain controller 211 after a predetermined time from this peak timing, and outputs the FFT timing signal TFFT to the OFDM demodulator 207.

Figure 11:
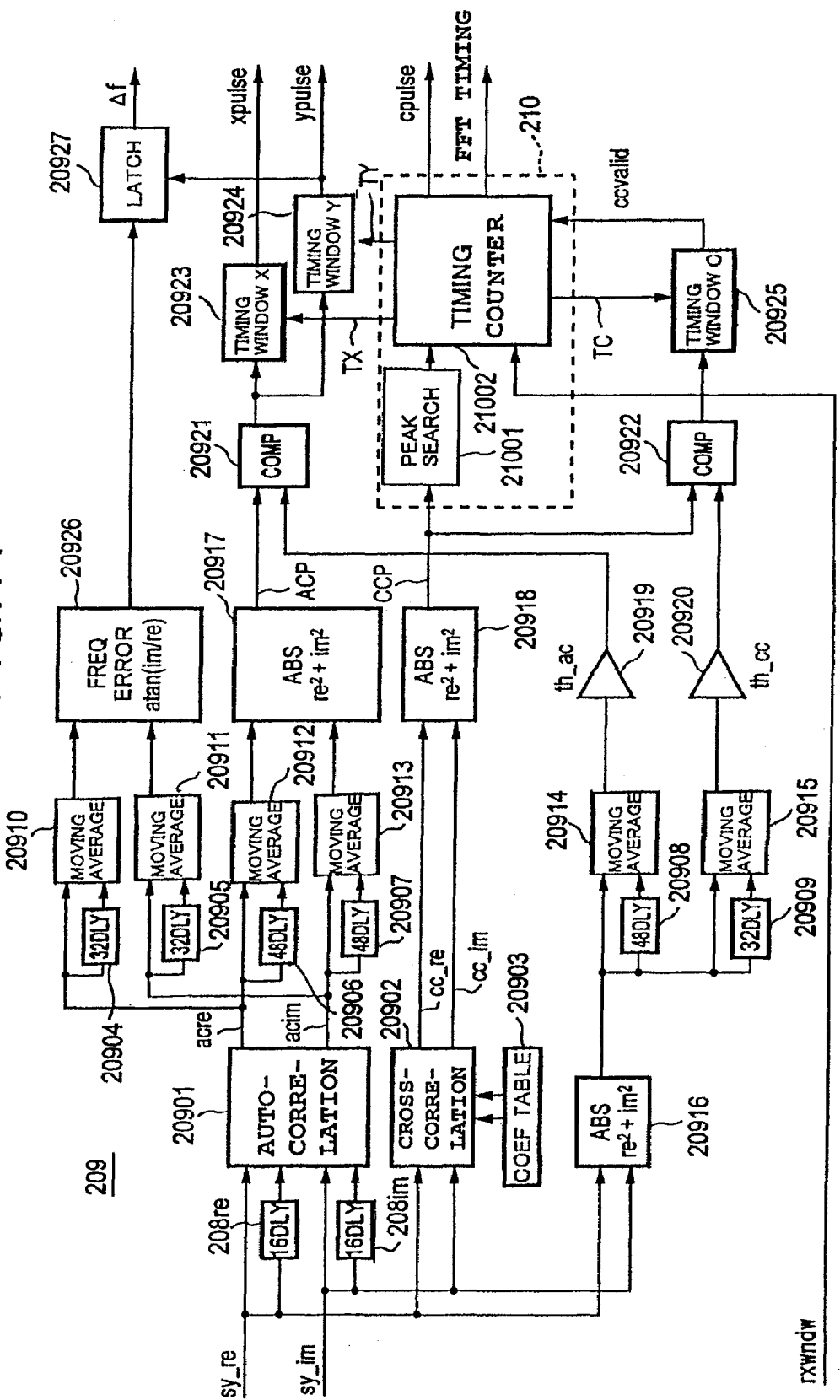
FIG. 11 is a circuit diagram showing a concrete example of the configuration of a burst detector and a timing controller of FIG. 2.

FIG. 11 is a circuit diagram showing a concrete example of the configuration of the burst detector 209 and the timing controller 210 of FIG. 2.

The burst detector 209 has an auto-correlation circuit 20901, cross-correlation circuit 20902, coefficient table 20903, delay units 20904 and 20905 having delays set to the amount of 32 clocks, delay units 20906 to 20909 having delays set to the amount of 48 clocks, moviving average circuits 20910 to 20915, absolute value calculation circuits 20916 to 20918, threshold value circuits 20919 and 20920, comparison circuits 20921 and 20922, a timing window X circuit 20923, timing window Y circuit 20924, timing window C circuit 20925, frequency error detection circuit 20926, and latch circuit 20927.

Further, the timing controller 210 has a peak search circuit 21001 and timing counter 21002.

The signals sy_re and sy_im supplied from the reception signal processing circuit 206 are input to the auto-correlation circuit 20901, cross-correlation circuit 20902, and absolute value calculation circuit 20916.

Further, the signal sy_re is delayed at the delay unit 208re by exactly the amount of 16 clocks and input to the auto-correlation circuit 20901. Similarly, the signal sy_im is delayed at the delay unit 208im by exactly the amount of 16 clocks and input to the auto-correlation circuit 20901.

Figure 12:
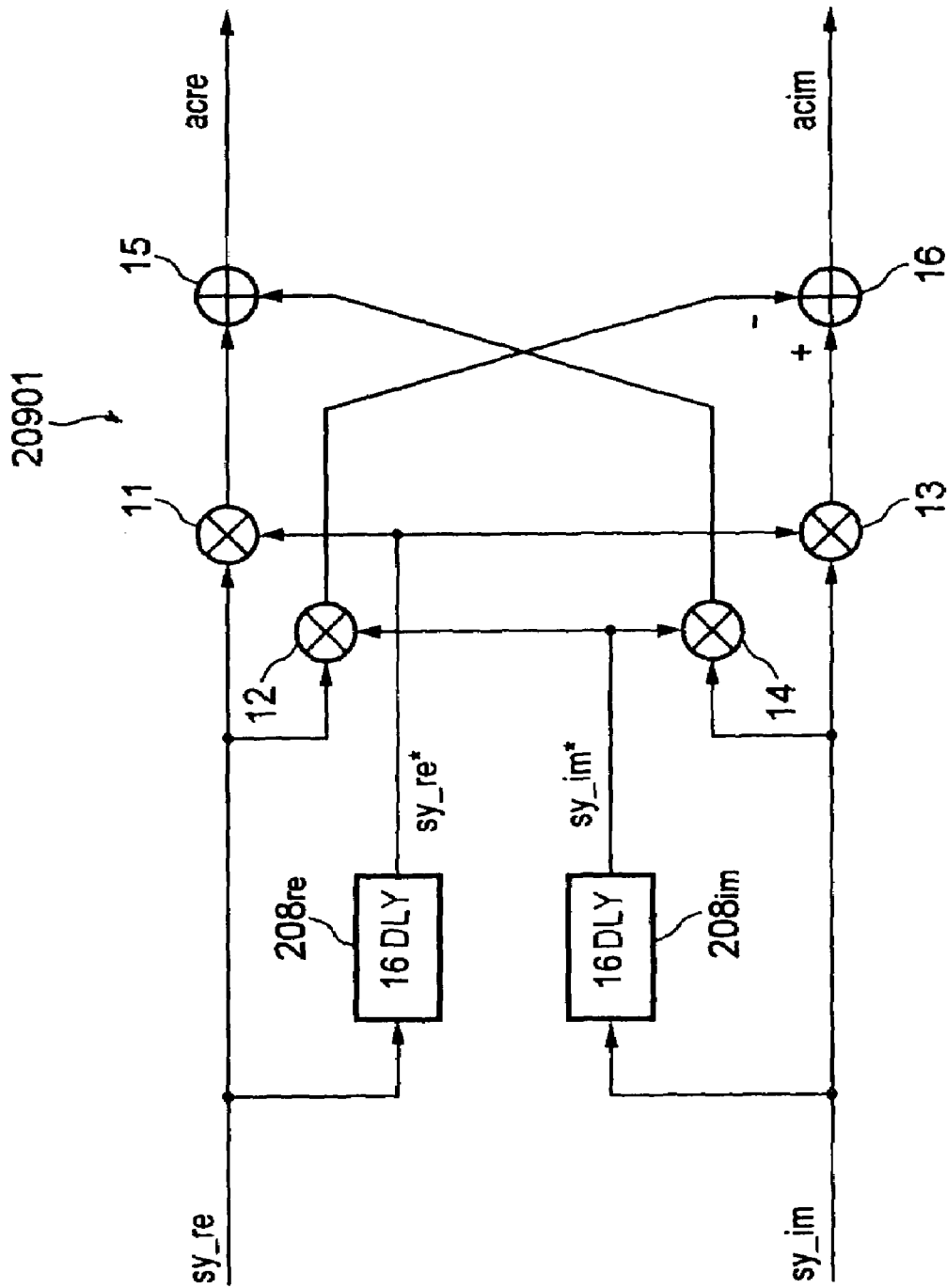
FIG. 12 is a circuit diagram showing an example of the configuration of an auto-correlation circuit of FIG. 11.

FIG. 12 is a circuit diagram showing an example of configuration of the auto-correlation circuit.

The auto-correlation circuit 20901 is configured by, as shown in FIG. 12, multipliers 11 to 14 and adders 15 and 16.

The auto-correlation circuit 20901 uses the fact that the front half X section and Y section of the preamble signal added to the header of the reception signal are frequency functions of 16 clocks, performs conjugated complex multiplication of the input signals sy_re and sy_im and the outputs sy_re* and sy_im* of the delay units 208re and 208im of 16 clocks to obtain auto-correlation outputs acre and acim, and outputs the same to the delay units 20904 to 20907 and the moving average circuits 20910 to 20913.

Concretely, the input signal sy_re and the delay signal sy_re* are complex multiplied at the multiplier 11, the input signal sy_re and the delay signal sy_im* are complex multiplied at the multiplier 12, the input signal sy_im and the delay signal sy_re* are complex multiplied at the multiplier 13, the input signal sy_im and the delay signal sy_im* are complex multiplied at the multiplier 14, and the output of the multiplier 11 and the output of the multiplier 14 are added at the adder 15 to thereby obtain the auto-correlation output signal acre, while the output of the multiplier 12 and the output of the multiplier 13 are added at the adder 16 to thereby obtain the auto-correlation output signal acim.

Figure 13:
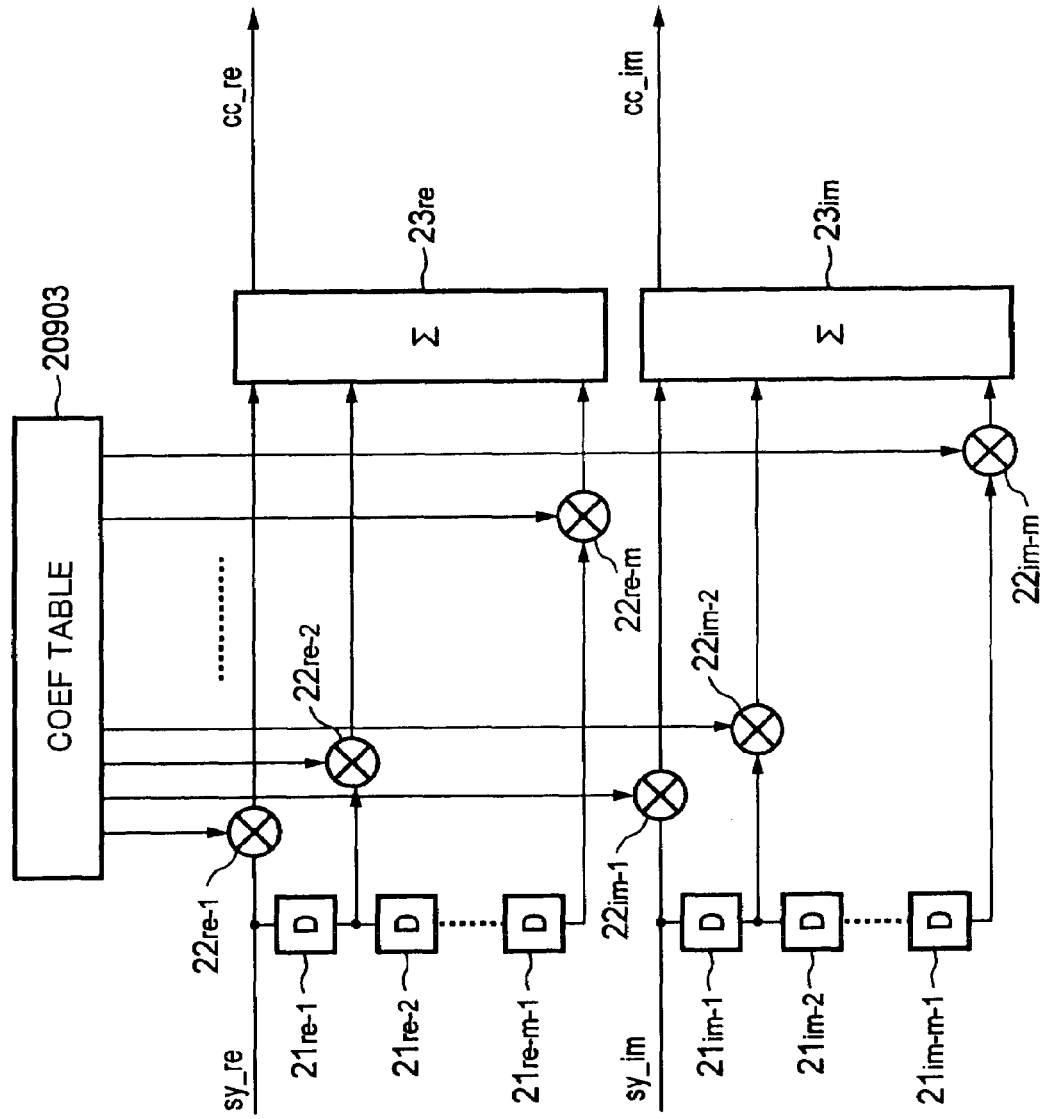
FIG. 13 is a circuit diagram showing the example of the configuration of a cross-correlation circuit of FIG. 11.

The cross-correlation circuit 20902 has, as shown in FIG. 13, (m−1) number of delay units 21re−1 to 21re−m−1 cascade connected with the input line of the signal sy_re and configuring a shift register, m number of multipliers 22re−1 to 22re−m for multiplying coefficients set in the coefficient table 20903 with respect to the input signal sy_re and the output signals of the delay units 21re−1 to 21re−m−1, and an adder 23re for adding the output signals of the m number of multipliers 22re−1 to 22re−m and outputting the cross-correlation output signal cc_re to the absolute value calculation circuit 20918.

Further, the cross-correlation circuit 20902 has, as shown in FIG. 13, (m−1) number delay units 21im−1 to 21im−m−1 cascade connected with the input line of the signal sy_im and configuring a shift register, m number of multipliers 22im−1 to 22im−m for multiplying coefficients set in the coefficient table 20903 with respect to the input signal sy_im and the output signals of the delay units 21im−1 to 21im−m−1, and an adder 23im for adding the output signals of the m number of multipliers 22im−1 to 22im−m and outputting the cross-correlation output signal cc_im to the absolute value calculation circuit 20918.

The cross-correlation circuit 20902 sequentially writes the input signals sy_re and sy_im in the shift register, multiplies the values of taps by the value of the coefficient table 20903 at the multipliers 22re−1 to 22re−m and 22im−1 to 22im−m, and obtains cross-correlation outputs cc_re and cc_im.

Note that, in the present embodiment, for example the number of taps of the shift register is set to 32, and the coefficient table stores the data value of 32 clocks before the rear half C64 section of the preamble signal.

The output signal acre of the auto-correlation circuit 20901 is input directly to the moving average circuit 20912 and after delayed by the amount of 48 clocks via the delay unit 20906, averaged (integrated), and input to the absolute value calculation circuit 20917.

Similarly, the output signal acim of the auto-correlation circuit 20901 is input directly to the moving average circuit 20913 and after delayed by the amount of 48 clocks via the delay unit 20907, averaged (integrated), and input to the absolute value calculation circuit 20917.

Then, the real portion re and the imaginary portion im are squared at the absolute value calculation circuit 20917 to calculate an absolute value ($re^2+im^2$) and thereby obtain the auto-correlation power ACP which is then output to the comparison circuit 20921.

Further, the output signal acre of the auto-correlation circuit 20901 is input directly to the moving average circuit 20910 and after delayed by the amount of 32 clocks via the delay unit 20904, averaged (integrated), and input to the frequency error detection circuit 20926.

Similarly, the output signal acim of the auto-correlation circuit 20901 is input directly to the moving average circuit 20911 and after delayed by the amount of 32 clocks via the delay unit 20905, averaged (integrated), and input to the frequency error detection circuit 20926.

The output signals cc_re and cc_im of the cross-correlation circuit 20902 are squared in the real portion re and the imaginary portion im at the absolute value calculation circuit 20918 to calculate the absolute value ($re^2+im^2$) and thereby obtain the cross-correlation power CCP which is then output to the comparison circuit 20922 and a peak search circuit 21001 of the timing controller 210.

Further, the input signals sy_re and sy_im are squared in the real portion re and the imaginary portion im at the absolute value calculation circuit 20916 to calculate the absolute value ($re^2+im^2$), and further input directly to the moving average circuit 20914 and after delayed by the amount of 48 clocks via the delay unit 20908, averaged (integrated), and input to the threshold circuit 20919.

Further, the output signal of the absolute value calculation circuit 20916 is input directly to the moving average circuit 20915 and after delayed by the amount of 32 clocks via the delay unit 20909, averaged (integrated), and input to the threshold circuit 20930.

The threshold value circuit 20919 defines the threshold value th_ac of the auto-correlation and supplies it to the comparison circuit 20921.

Further, the threshold value circuit 20920 defines the threshold value th_cc of the cross-correlation and supplies it to the comparison circuit 20922.

The comparison circuit 20921 compares the auto-correlation power ACP and the auto-correlation threshold value th_ac and outputs the result thereof to the timing window X circuit 20923 and the timing window Y circuit 20924.

Further, the timing controller 210 monitors the peak timing of the cross-correlation power CCP from the burst detector 209 by the peak search circuit 21001 and outputs the timing thereof to the timing counter 21002.

The timing counter 21002 increments the count triggered by the input of the trigger signal rxwndw and outputs the timing signals TX, TY and TC to the timing window X circuit 20923, timing window Y circuit 20924, and timing window C circuit 20925 of the burst detector 209 at predetermined timings.

Due to this, by applying timing windows to the comparison results of the timing window circuits 20923, 20924, and 20925, the timing window X circuit 20923 outputs the first synchronization detection signal xpulse, and the timing window Y circuit 20924 outputs the second synchronization detection signal ypulse to the amplification gain controller 211.

Further, the timing control circuit 210 receives the peak timing of the cross-correlation power CCP at the peak search circuit 21001. The timing counter 21002 outputs the third synchronization detection signal cpulse to the amplification gain controller 211 after a constant time after the peak timing and outputs the FFT timing signal TFFT to the OFDM demodulator 207.

FIG. 14A to FIG. 14G are views showing timing charts from the auto-correlation processing of the burst detector to when the synchronization detection signals xpulse and ypulse are output.

Figure 14:
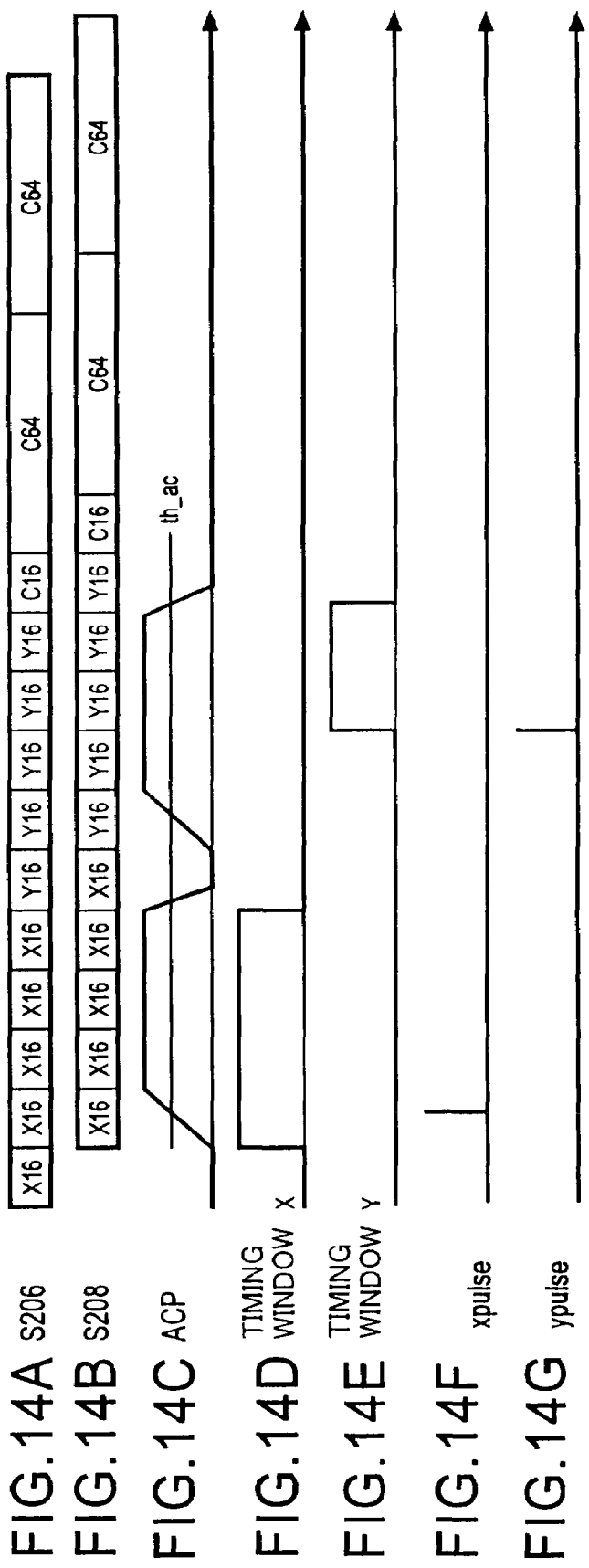
FIGS. 14A to 14G are views showing timing charts from the auto-correlation processing of the burst detector to when synchronization detection signals xpulse and ypulse are output.

In FIGS. 14A to 14G, FIG. 14A shows the portion of the preamble and reference of the input signal S206 (sy_re, sy_im); FIG. 14B shows the delay signal S208 obtained by delaying the signal S206 by the delay unit 208; FIG. 14C shows the auto-correlation power ACP; FIG. 14D shows the timing window X; FIG. 14E shows the timing window Y; FIG. 14F shows the first synchronization detection signal xpulse; and FIG. 14G shows the second synchronization detection signal ypulse.

In the preamble signal of the Wireless 1394, as shown in FIG. 14A and FIG. 14B, there are 5 periods of a 16 clock period X section and Y section. As shown in FIG. 14C, the auto-correlation power ACP rises in the X and Y sections.

Accordingly, as shown in FIGS. 14A, 14B, and 14D, by applying the timing window X to the X section of the front half and applying the timing window Y to the Y section of the rear half as shown in FIGS. 14A, 14B, and 14E, the arrival of each section is detected and thus the first synchronization detection signal xpulse and the second synchronization detection signal ypulse can be output as shown in FIGS. 14F and 14G.

Figure 15:
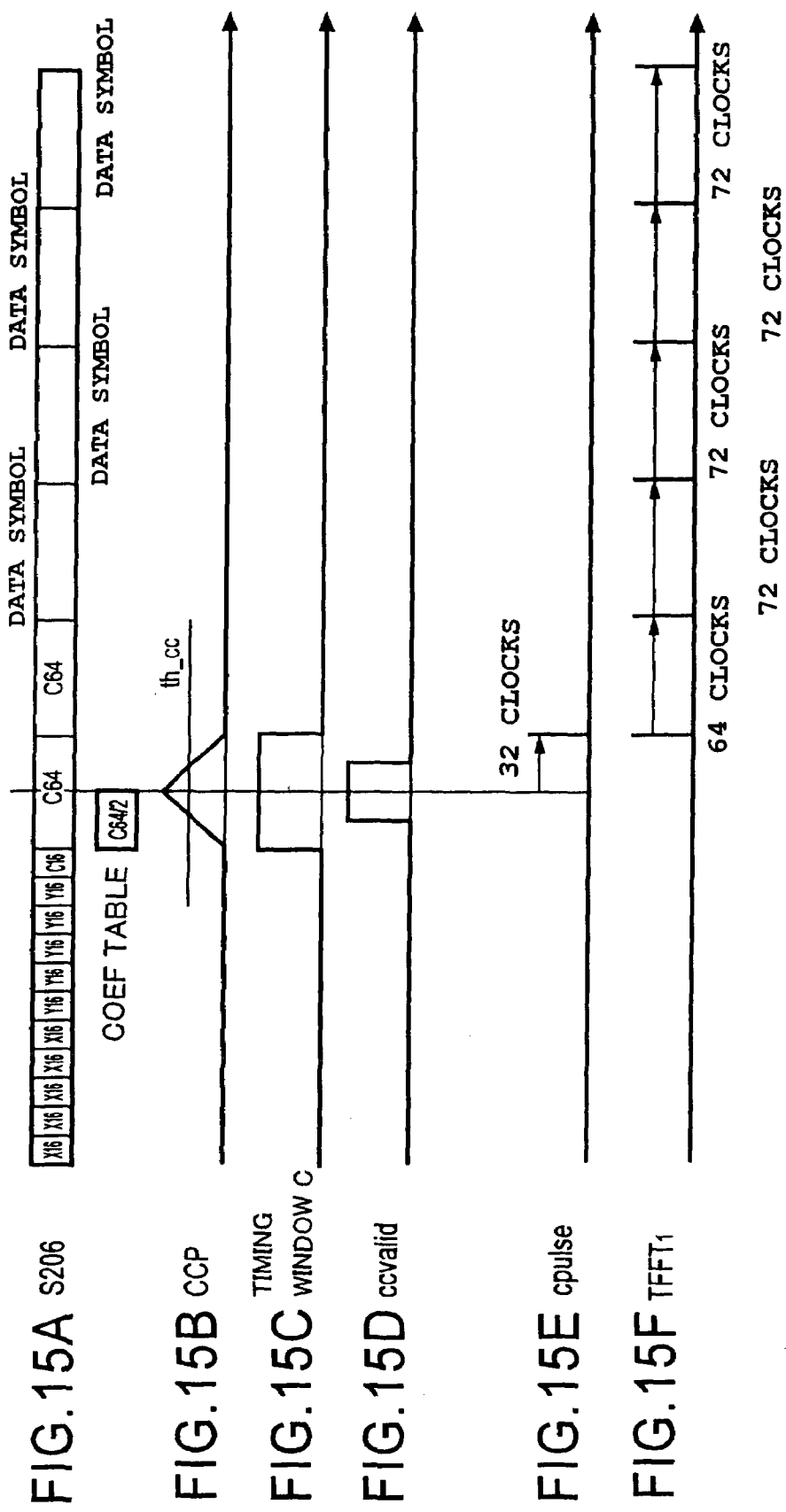
FIGS. 15A to 15F are views showing timing charts from the cross-correlation processing of the burst detector to when a synchronization detection signal cpulse and an FFT timing signal TFFT are output.

FIGS. 15A to 15F are views showing the timing charts from the cross-correlation processing of the burst detector to when the third synchronization detection signal cpulse and the FFT timing signal TFFT are output In FIGS. 15A to 15F, FIG. 15A shows the input signal S206 (sy_re, sy_im); FIG. 15B shows the cross-correlation power CCP; FIG. 15C shows the timing window C; FIG. 15D shows the valid signal ccvalid output from the timing window circuit 20925; FIG. 15E shows the third synchronization detection signal cpulse; and FIG. 15F shows the FFT timing signal TFFT.

In the present embodiment, as the coefficient table 20903 of the cross-correlation, the data values of the front 32 clocks of the C64 section are used. Therefore, as shown in FIG. 15B, the cross-correlation power CCP becomes the maximum at the 32nd clock of the C64 section.

As shown in FIG. 15C, by setting the timing window C before or after the timing at which the cross-correlation power CCP becomes the maximum, more correct peak detection can be carried out. After 32 clocks from the peak timing detected in this way, as shown in FIGS. 15E and 15F, the third synchronization detection signal cpulse and FFT timing signal TFFT are output.

Thereafter, as shown in FIG. 15F, the FFT timing signal TFFT is output after 64 clocks, then repeatedly output in 72 clock periods.

The frequency error detection circuit 20926 finds the phase difference from the real portion and the imaginary portion of the auto-correlation output signal and calculates the error frequency $\Delta f$ from here as shown in the next Equation (4).

$$\Delta f = \tan^{-1}(acim/acre) \times (1/32) \times 20 \times 10^{-6} (Hz) \qquad (4)$$

The amplification gain controller 211 controls the reception signal to become the optimum signal level by performing gain control by changing the control gain voltage Vagc for controlling the gain of the automatic gain control amplifier 201 matched with the synchronization burst detection timing as will be explained in detail later based on the digital reception signal S206 after the gain control by the automatic gain control amplifier 201 from the reception signal processing unit 206, the digital field strength signal RSSID indicating the peak level of the reception signal RS of the reception signal power monitor 202 from the A/D converter 205, the first and second synchronization detection signals S209W (xpulse, ypulse) as the synchronization timing window signals from the burst detector 209, and the third synchronization detection signal S210 (cpulse) from the timing controller 210, and outputs the gain control signal Vagc via the D/A converter 204 to the automatic gain control amplifier 201.

Figure 16:
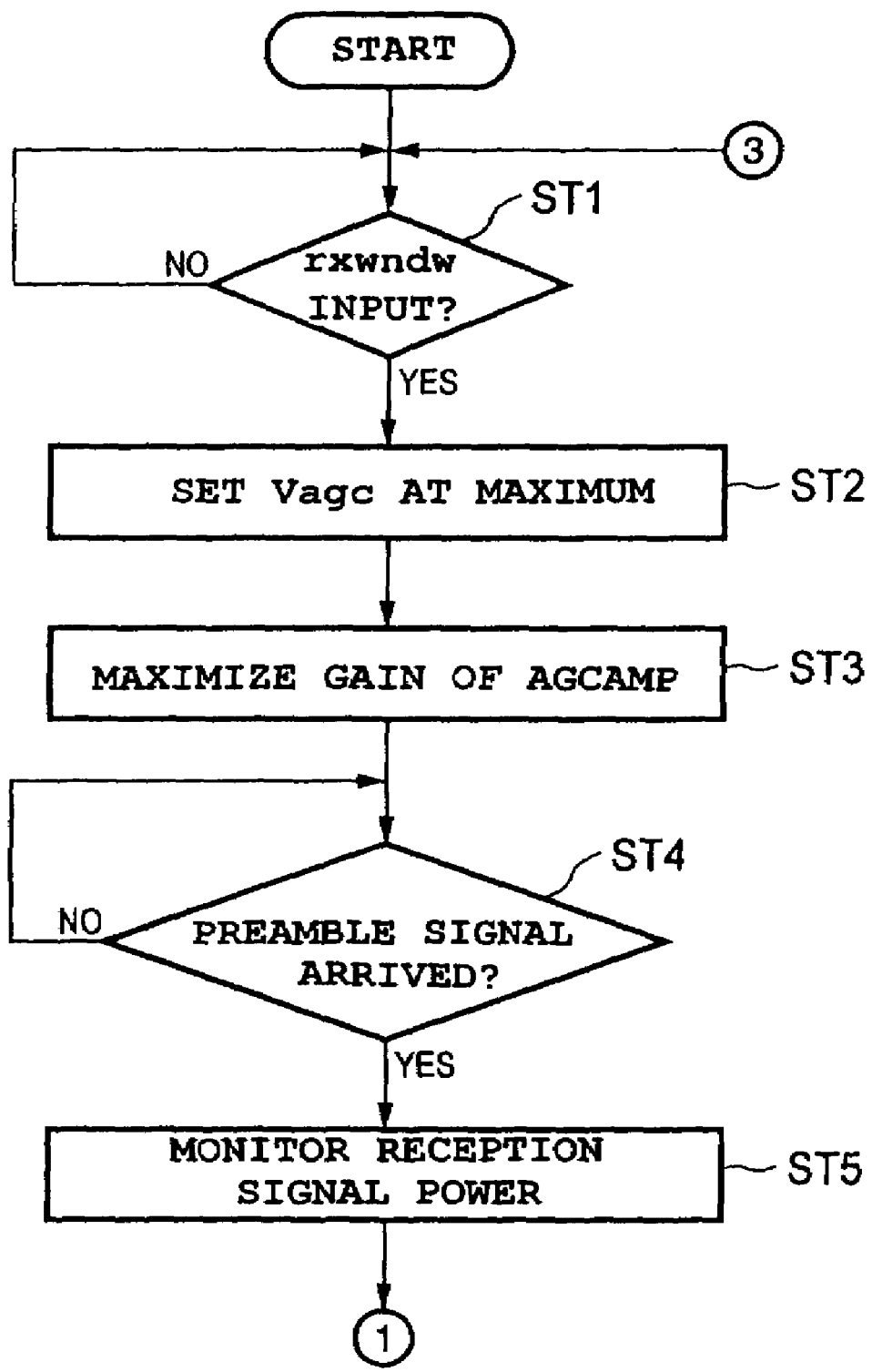
FIG. 16 is a flow chart for explaining a first stage of a gain control operation in the amplification gain controller according to the present invention.
Figure 17:
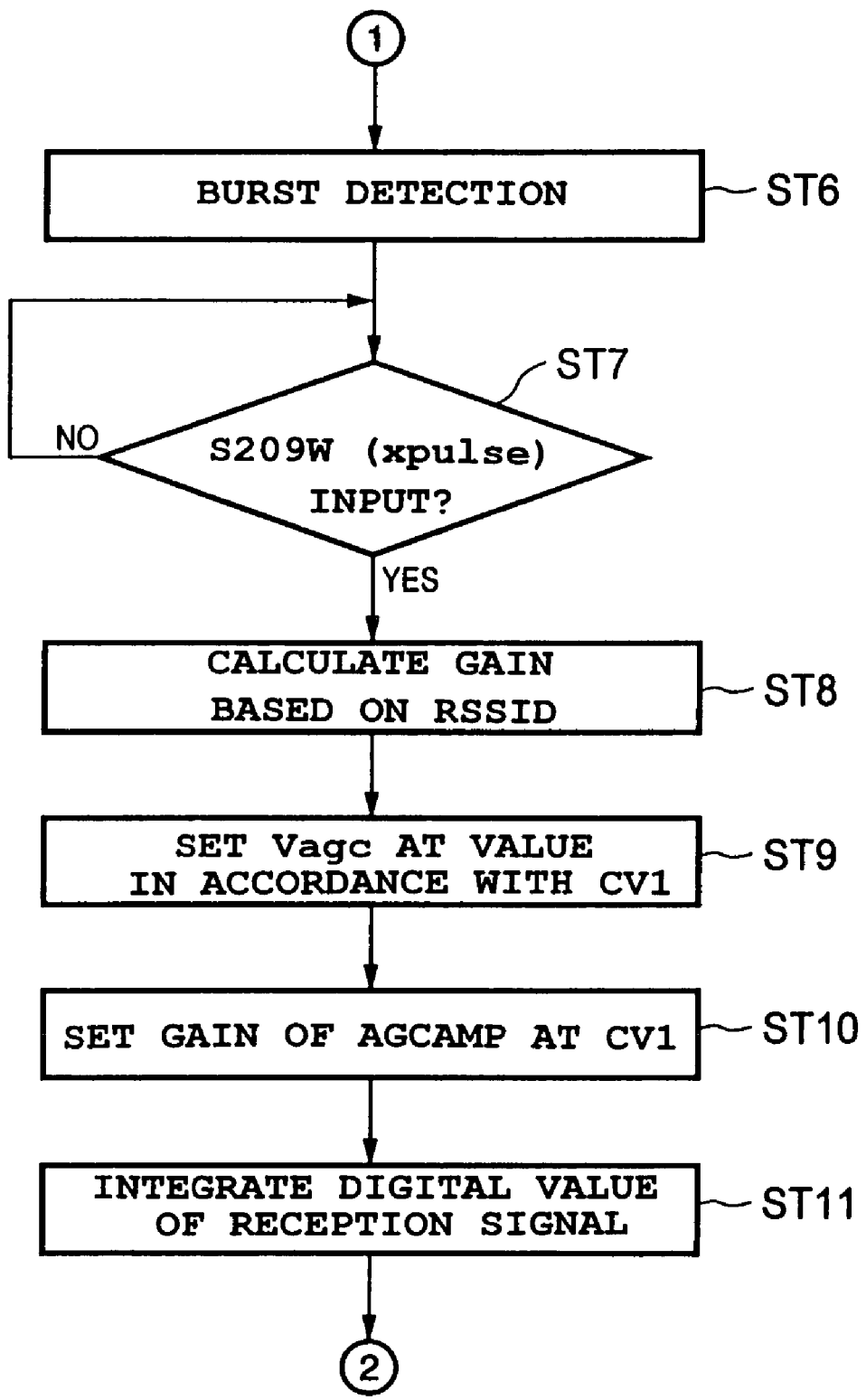
FIG. 17 is a flow chart for explaining a second stage of a gain control operation in the amplification gain controller according to the present invention.
Figure 18:
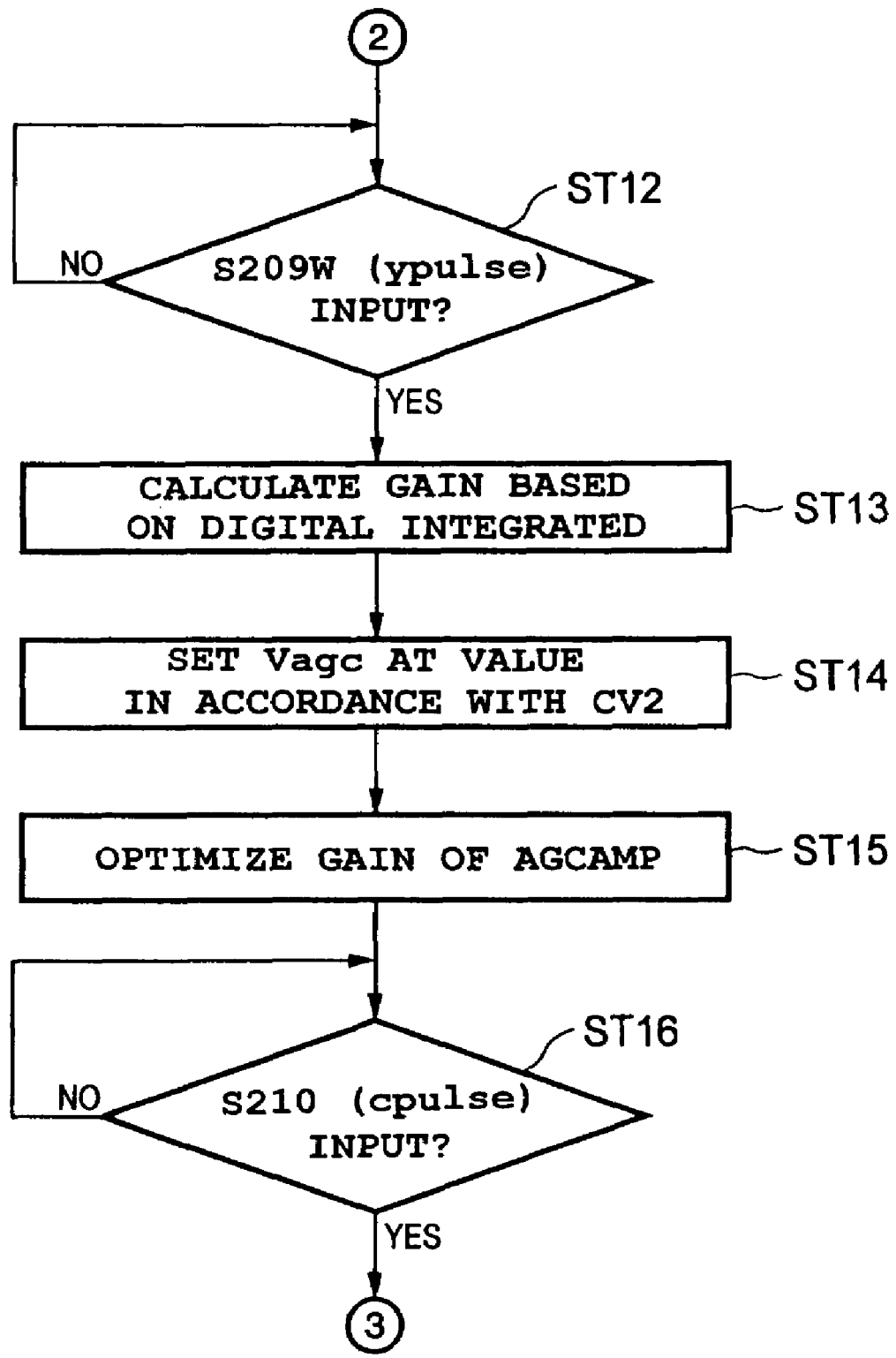
FIG. 18 is a flow chart for explaining a third stage of a gain control operation in the amplification gain controller according to the present invention.

Below, the gain control operation of the amplification gain controller 211 will be explained in detail in relation to the flow charts of FIG. 16, FIG. 17, and FIG. 18.

In the present embodiment, in the preamble section of the reception signal, three step level acquisition is carried out in order to realize high speed and high performance level acquisition.

As the first stage, at the time of the start of the burst detection (ST1), the gain control signal Vagc is output from the amplification gain controller 211 with the maximum value (ST2), the gain of the automatic gain control amplifier 201 is set at the maximum (first gain) (ST3), and the burst detection is carried out by a combination of the delay unit 208 and the burst detector 209.

At this time, the output signal of the A/D converter 203 ends up being distorted, but since it is not the data signal, deterioration of the reception signal quality is not induced.

Further, even if the preamble signal is distorted, the burst detector 209 uses the auto-correlation circuit 20901, so burst detection is possible without lowering the detection rate.

In this way, the arrival of the preamble signal at the header of the reception signal RS is waited for (ST4).

In parallel with this, the reception signal power is monitored at the reception signal power monitor 202, and the field strength signal RSSI of the reception signal power signal is input as the digital signal RSSID via the A/D converter 205 (ST5).

Here, as explained before, in order to deal with abrupt signal changes, not the mean value, but the peak value is detected. Note that, the reset signal is given at the time of starting the burst detection, the peak value detection circuit is reset, and the maximum top value after that is observed.

As the second stage, at the time of the burst detection (ST6), upon receipt of the first synchronization detection signal S209W (xpulse) from the burst detector 209 (ST7), the gain is calculated based on the level of the digital field strength signal RSSID (ST8), the gain control signal Vagc is set at the calculated value CV1 (ST9), and the gain of the automatic gain control amplifier 201 is set at the calculated value CV1 (second gain) via the D/A converter 204 (ST10).

The control gain CG1 at this time is calculated based on the following equation:

$$CG1 [dB] = VRSSI [dbv] - Vref1 [dBv] \quad (5)$$

Here, VRSSI indicates the reception signal power value monitored at the reception signal power monitor 202, and Vref1 indicates the first reference signal power value of a suitable value not distorting the A/D converter 203.

Note, at this time, the gain of the automatic gain control amplifier 201 includes the analog signal processing in the calculation step of the peak value of the reception signal power and includes slight variation, so is rough gain control.

For this reason, after passing this gain through the A/D converter 203 without distortion, the digital value of the reception signal is integrated at the amplification gain controller 211 to measure the correct signal power (ST11).

As the third stage, after a certain time passes in the second stage, by receiving the second synchronization detection signal S209W (ypulse) from the burst detector 209 (ST12), the gain is calculated based on the digital integrated value of the reception signal S206 passed through the A/D converter 203 without distortion (ST13), the gain control signal Vagc is set at the calculated value CV2 (ST14), and the gain of the automatic gain control amplifier 201 is set at the calculated value CV2 (third gain) via the D/A converter 204 and optimized (ST15).

The control gain CG2 at this time is calculated based on the following equation:

$$CG2 [dB] = VI [dBv] - Vref2 [dBv] \quad (6)$$

Here, VI indicates the reception signal power value integrated at the amplification gain controller 211 and after passing through the A/D converter 203, and Vref2 indicates the second reference signal power value and the optimum value of the reception signal power after the gain control.

In this way, the optimized gain value is fixed until the data signal is terminated thereafter and the next burst detection starts (ST16).

Then, when the third synchronization detection signal S210 (cpulse) from the timing controller 210 is input, the operation routine shifts to the processing of the above step ST1.

Note that, since the burst detection is started, the reset signal is given to the reception signal power monitor 202, the peak detection circuit 2021 is reset, and the maximum peak value after that is monitored.

By the above, a high speed and correct level acquisition to the optimum gain value can be realized.

Figure 19:
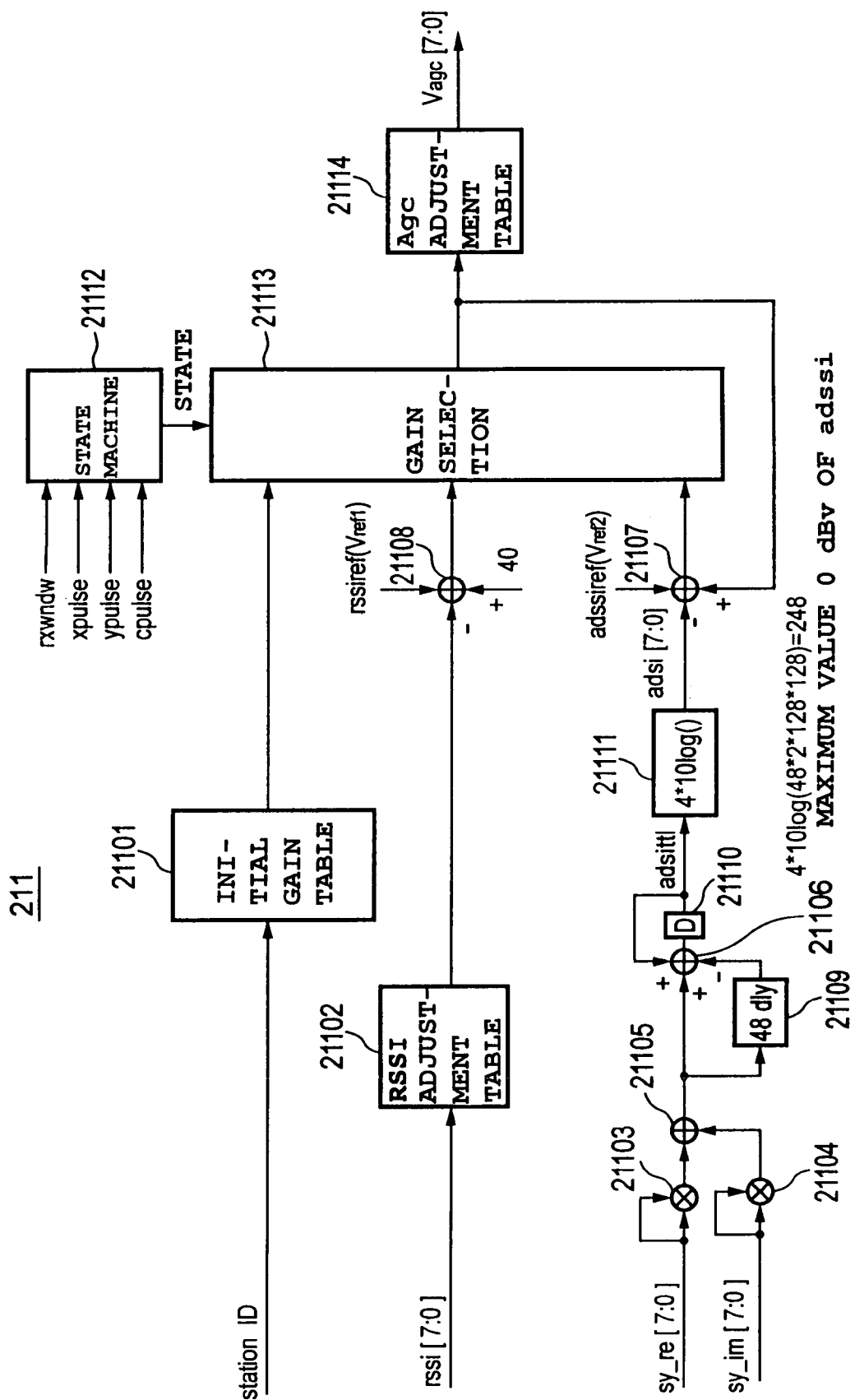
FIG. 19 is a circuit diagram showing a concrete example of the configuration of the amplification gain controller of FIG. 2.

FIG. 19 is a circuit diagram showing a concrete example of the configuration of the amplification gain controller 211 of FIG. 2.

The amplification gain controller 211 has, as shown in FIG. 19, an initial gain table 21101, RSSI adjustment table 21102, multipliers 21103 and 21104, adders 21105 to 21108, a delay unit 21109 having a delay of the amount of 48 clocks, delay unit 21110, logarithm converter 21111, state machine circuit 21112, gain selection circuit 21113, and control gain adjustment table 21114.

This amplification gain controller 211 employs a state machine configuration based on the timing pulses of the synchronization detection, that is, the trigger signal rxwndw, first synchronization detection signal xpulse and second synchronization detection signal ypulse from the burst detector 209, and the third synchronization detection signal cpulse from the timing controller 210, and controls the different gains agc of the automatic gain control amplifier 201 to be output in the states 0 to 3.

FIG. 20A to FIG. 20H are views showing timing charts for explaining the operation of the amplification gain controller of FIG. 19.

In FIGS. 20A to 20H, FIG. 20A shows the input signal S206 (sy_re, (sy_im); FIG. 20B shows the trigger signal rxwndw; FIG. 20C shows the first synchronization detection signal xpulse; FIG. 20D shows the second synchronization detection signal ypulse; FIG. 20E shows the third synchronization detection signal cpulse; FIG. 20F shows the state; FIG. 20G shows the gain control signal Vagc; and FIG. 20H shows the reception signal RX output from the automatic gain control amplifier 201.

Below, the operations in the different states in the amplification gain controller of FIG. 19 will be explained in relation to FIG. 20A to FIG. 20H.

State 0 (Initial Mode, rxwndw Waiting Mode)

A proper gain is selected from the initial gain table 21101 based on the flag signal StationID. In the present embodiment, the initial gain table 21101 is set so that the maximum gain is obtained.

Then, as shown in FIGS. 20B, 20F, and 20G, at the rising timing of the trigger signal rxwndw, this is passed through the gain selection circuit 21113 and output from the control gain adjustment table 21114 as the gain control signal Vagc, then the operation routine shifts to the State 1.

State 1 (Xpulse Waiting Mode)

As shown in FIGS. 20F and 20G, as the gain control signal Vagc, the initial gain (maximum gain) determined by the initial F gain table 21101 is output.

Upon receipt of the field strength signal RSSI via the A/D converter 205, the RSSI gain gain_rssi based on the reception signal power is calculated at the adder 21108 as in Equation (6). Then, as shown in FIGS. 20C, 20F, and 20G, at the input timing of the first synchronization detection signal xpulse, the selected gain of the gain selection circuit 21113 is switched from the initial gain to the RSSI gain gain_rssi by the adder 21108 and output from the control gain adjustment table 21114 as the gain control signal Vagc, then the operation routine shifts to State 2.

$$gain\_rssi = rssiref - rssi + 40 \quad (6)$$

Here, rssiref is the value reduced by 40 in advance due to the bit width being determined as 8 bits in the RSSI reference value and is corrected by adding 40 at the time of the calculation of the gain.

State 2 (Ypulse Waiting Mode)

As shown in FIGS. 20F and 20G, as the gain control signal Vagc, RSSI gain gain_rssi is output.

By squaring the input signal sy_re at the multiplier 21103, squaring the input signal sy_im at the multiplier 21104, and adding them at the adder 21105, the amplitude of the input reception signal is found. Further, the digital integrated value is found through the adder 21106, delay unit 21109, and delay unit 21110, and the reception signal level adssi is calculated as in Equation (7) in the logarithm converter 21111.

$$adssi = 4 \times 10 \log (re^{2+im2}) \quad (7)$$

Then, by using the reception signal level adssi and the optimum value adssiref of the reception signal power after the gain control and the now selected RSSI gain gain_rssi, the adssi gain gain_rssi is calculated as in Equation (8). Then, as shown in FIGS. 20D, 20F, and 20G, at the input timing of the second synchronization detection signal ypulse, the selected gain of the gain selection circuit 21112 is switched from RSSI gain gain_rssi to the adssi gain gain_rssi by the adder 21107 and output from the control gain adjustment table 21114 as the gain control voltage signal Vagc, then the operation routine shifts to State 3.

$$gain\_adssi = adssiref - adssi + gain\_rssi \quad (8)$$

State 3 (Cpulse Waiting Mode)

As shown in FIGS. 20F and 20G, as the gain control signal Vagc, the adssi gain gain_rssi is output.

Then, as shown in FIGS. 20E and 20F, the operation routine shifts to State 0 at the input timing of the third synchronization detection signal cpulse.

Note, the gain control voltage signal Vagc holds the adssi gain gain_rssi.

Next, the operation by the configuration of FIG. 2 will be explained.

First, at the start of the burst detection, the gain control signal Vagc is set at the maximum value and output triggered by the trigger signal rxwndw by the amplification gain controller 211. This gain control signal Vagc is converted to the analog signal at the D/A converter 204 and supplied to the automatic gain control amplifier 201.

The automatic gain control amplifier 201 receives the analog gain control signal Vagc and sets the gain at the maximum first gain.

In this state, the state of waiting for the input of the reception signal RS is entered.

In such a state, first, the preamble signal at the header of the reception signal RS is input to the automatic gain control amplifier 201.

The automatic gain control amplifier 201 amplifies a schematically X section of the front half of the preamble signal of the reception signal RS with the maximum gain and outputs the result as the signal RX to the A/D converter 203.

In parallel to this, the preamble signal of the reception signal RS is input to the reception signal power monitor 202. The reception signal power monitor 202 monitors the power of the reception signal RS, measures the peak voltage, converts the result to the field strength signal RSSI of a voltage signal taking a value in accordance with the input reception signal level, and outputs the result to the A/D converter 205.

The field strength signal RSSI of this reception signal power signal is input via the A/D converter 205 to the amplification gain controller 211 as the digital signal RSSID.

The A/D converter 203 converts the preamble signal portion of the reception signal RS from an analog signal to a digital signal and supplies the result as the signal RXD to the reception signal processing unit 206.

At this time, the output signal of the A/D converter 203 ends up being distorted, but it is not the data signal, so deterioration of the reception signal quality is not caused.

The reception signal processing unit 206 converts the input digital reception signal RXD to the baseband signals bb_re (real portion) and the bb_im (imaginary portion) and converts the sampling frequency of the baseband signal to a low frequency.

Then, at this time, since the error detection frequency Δf by the burst detector 209 has not been supplied, the frequency offset is not corrected, then the signal S206 (sy_re and sy_im) is generated and output to the OFDM demodulator 207, delay unit 208, and the burst detector 209.

The delay unit 208 delays the output signal S206 of the reception signal processing unit 206, that is, the signals sy_re and sy_im, by the amount of the burst period for the burst detection and outputs the result as the signal S208 to the burst detector 209.

The burst detector 209 performs auto-correlation and cross-correlation between the signals S206 (sy_re and sy_im) from the reception signal processing unit 206 and the delay signals S208 from the delay unit 208.

Then, it detects the burst signal of the period determined by the communication system based on the auto-correlation result, first generates the first synchronization detection signal S209W (xpulse) indicating that the front half X section of the preamble signal is detected, and outputs it to the amplification gain controller 211.

Note that, even if the preamble signal is distorted, since the burst detector 209 uses the auto-correlation circuit, burst detection is possible without lowering the detection rate.

First, the burst detector 209 calculates the error frequency from the phase difference between the real portion and the imaginary portion of the reception signal based on the auto-correlation result, generates the error detection frequency Δf, and outputs it to the reception signal processing unit 206.

The amplification gain controller 211 receives the burst synchronization detection signal S209W (xpulse) from the burst detector 209, calculates the gain based on the level of the digital field strength signal RSSID, and sets the gain control signal Vagc at the calculated value CV1.

This gain control signal Vagc is converted to an analog signal at the D/A converter 204 and supplied to the automatic gain control amplifier 201.

The automatic gain control amplifier 201 receives the analog gain control signal Vagc and sets the gain at the second gain as the calculated value.

Note, at this time, the gain of the automatic gain control amplifier 201 includes the analog signal processing in the calculation step of the peak value of the reception signal power and includes slight variation, so is rough gain control.

The automatic gain control amplifier 201 amplifies the remaining X section and the Y section of the rear half of the preamble signal of the reception signal RS with the second gain in accordance with the reception signal level and outputs the result as the signal RX to the A/D converter 203.

The A/D converter 203 converts the preamble signal portion of the reception signal RS from an analog signal to a digital signal and supplies the result as the signal RXD to the reception signal processing unit 206.

At this time, the input signal of the A/D converter 203 has been amplified with a gain based on a suitable value not distorting the A/D converter 203, so distortion does not occur in the output signal of the A/D converter 203.

The reception signal processing unit 206 converts the input digital reception signal RXD to the baseband signals bb_re (real portion) and bb_im (imaginary portion) and converts the sampling frequency of the baseband signal to a low frequency.

Then, it corrects the frequency offset based on the error detection frequency Δf from the burst detector 209, generates the signal S206 (sy_re and sy_im), and outputs this to the OFDM demodulator 207, delay unit 208 and the burst detector 209.

The delay unit 208 delays the output signal S206 of the reception signal processing unit 206, that is, the signals sy_re and sy_im, by the amount of the burst period for the burst detection and outputs the result as the signal S208 to the burst detector 209.

The burst detector 209 performs auto-correlation and cross-correlation between the signal S206 (sy_re and sy_im) from the reception signal processing unit 206 and the delay signal S208 from the delay unit 208.

Then, it detects the burst signal of the period determined by the communication system based on the auto-correlation result, generates a synchronization detection signal S209W (ypulse) indicating that the rear halfY section of the preamble signal is detected, and outputs this to the amplification gain controller 211.

Further, the burst detector 209 calculates the error frequency from the phase difference between the real portion and the imaginary portion of the reception signal based on the auto-correlation result, generates the error detection frequency Δf, and outputs it to the reception signal processing unit 206.

The amplification gain controller 211 receives the signal S206 with the gain based on the reception signal power and passed through the A/D converter 203 without distortion, integrates the digital value of the reception signal, and measures the correct signal power.

Further, the amplification gain controller 211 receives the second synchronization detection signal S209W (ypulse) from the burst detector 209, calculates the gain based on the digital integrated value of the reception signal S206 passed through the A/D converter 203 without distortion, and sets the gain control signal Vagc at the calculated value CV2.

This gain control signal Vagc is converted to an analog signal at the D/A converter 204 and supplied to the automatic gain control amplifier 201.

The automatic gain control amplifier 201 receives the analog gain control signal Vagc and sets the gain at the third gain as the optimum calculated value.

The automatic gain control amplifier 201 amplifies the remaining Y section and the reference C64 after C16 and the data of the preamble signal of the reception signal RS with the third gain in accordance with the reception signal level and outputs the result as the signal RX to the A/D converter 203.

The A/D converter 203 converts the reference C64 and the data portion of the reception signal RS from analog signals to digital signals and supplies the results as the signal RXD to the reception signal processing unit 206.

At this time, the input signals of the A/D converter 203 have been amplified with the gain based on the optimum value not distorting the A/D converter 203, so distortion does not occur in the output signal of the A/D converter 203.

The reception signal processing unit 206 converts the input digital reception signal RXD to the baseband signals bb_re (real portion) and bb_im (imaginary portion) and converts the sampling frequency of the baseband signal to a low frequency.

Then, it corrects the frequency offset based on the error detection frequency Δf from the burst detector 209, generates the signal S206 (sy_re and sy_im), and outputs it to the OFDM demodulator 207, delay unit 208, and burst detector 209.

The delay unit 208 delays the output signal S206 of the reception signal processing unit 206, that is, the signals sy_re and sy_im, by the amount of the burst period for the burst detection and outputs the result as the signal S208 to the burst detector 209.

The burst detector 209 performs the auto-correlation and cross-correlation between the signals S206 (sy_re and sy_im) from the reception signal processing unit 206 and the delay signals S208 from the delay unit 208.

Then, the cross-correlation power as the cross-correlation result is supplied to the timing controller 210, the peak timing is monitored based on this, the third synchronization detection signal S210 (cpulse) is output to the amplification gain controller 211 after the predetermined time from this peak timing, and the FFT timing signal TFFT is output to the OFDM demodulator 207.

The amplification gain controller 211 receiving the third synchronization detection signal S210 (cpulse) returns to the initial mode, that is, the waiting mode of the trigger signal rxwndw.

Thereafter, the optimized gain value is fixed until the data signal is terminated after that and the next burst detection starts.

The OFDM demodulator 207 processes the output signal S206 of the reception signal processing unit 206, that is, the signals sy_re and sy_im, by a high speed discrete Fourier transform in synchronization with the FFT timing signal TFFT supplied from the timing controller 210 to demodulate the OFDM signal.

As explained above, according to the present embodiment, since the circuit comprises the automatic gain control amplifier 201 for amplifying an input reception signal level with a gain in accordance with a gain control signal; A/D converter 203 for converting an output signal of the automatic gain control amplifier 201 from an analog signal to a digital signal; reception signal power monitor 202 for detecting a power of the reception signal; delay unit 208 for delaying an output of the automatic gain control amplifier by a predetermined time; burst detector 209 for burst detection based on a correlation operation between the digital reception signal and the output signal of the delay unit, outputting a first burst synchronization detection signal when detecting a front half section of a preamble signal, and outputting a second burst synchronization detection signal when detecting a rear half section; and amplification gain controller 211 for outputting an gain control signal to the automatic gain control amplifier so as to amplify the reception signal with the maximum value when receiving a trigger signal indicating the start of the burst detection, calculating a second gain based on the reception signal power value detected at the reception signal power monitor when receiving a first burst synchronization detection signal from the burst detector, outputting the gain control signal to the automatic gain control amplifier so as to amplify the reception signal with the second gain, receiving the digital reception signal amplified with the second gain and integrating the same to find the reception signal power value, calculating the third gain based on the found reception signal power value when receiving a second burst synchronization detection signal from the burst detector, and outputting the gain control signal to the automatic gain control amplifier so as to amplify the reception signal with the third gain, the following effects can be obtained.

It becomes possible to perform high speed-and correct level acquisition. As a result, in a wireless LAN or other burst synchronization type communication system, there is the advantage such that a high performance reception quality can be realized.

Further, when the burst detection can be carried out for the preamble signal in two stages, by performing rough gain control at the time of the first burst detection and performing precise gain control at the time of the next burst detection, recovery where the timing of the first burst detection is mistaken can be carried out.

Further, it is possible to specify the pattern of the signal to be digitally integrated and perform more correct level acquisition.

Further, even in a case where the first burst detection is mistaken, it can be judged whether or not the second burst detection can be carried out and level acquisition at the erroneous timing can be avoided.

Note that when the second burst detection is not carried out even if a constant time elapses after the first burst detection, by resetting the level acquisition and returning to the first stage of the level acquisition, detection of the burst signal coming next with a high probability can be enabled.

Further, in the Wireless 1394 system, in order to support the synchronization transfer mode, a reference signal is inserted in the data signal at constant intervals.

At the timing of this reference signal, by changing the gain control signal from the amplification gain controller 211, level acquisition can be finely adjusted and it becomes possible to hold the reception performance in the synchronization transfer mode at a high quality.

Note that, the gain control signal output from the amplification gain controller 211 at the timing of the reference signal can be calculated by using the above Equation (6) based on the digital integrated value in the C64 section of the previous reference signal.

In this way, when the synchronization transfer mode is supported and the reference signal is inserted for every constant period in the data signal, by finely adjusting the level acquisition for every reference signal, there is the advantage that level acquisition under a multi-path environment can be more correctly realized.

INDUSTRIAL APPLICABILITY

An automatic gain control circuit and the method of same and demodulation apparatus of the present invention can perform high speed and correct level acquisition, so can be applied to a wireless LAN or other burst synchronization type communication system.

Further, the automatic gain control circuit and the method of same and demodulation apparatus of the present invention can realize level acquisition under a multi-path environment more correctly by finely adjusting the level acquisition for every reference signal, so can be applied to a system wherein the synchronization transfer mode is supported and the reference signal is inserted in the data signal for every constant period as in the Wireless 1394 system.

The invention claimed is:

1. An automatic gain control circuit for control of an amplification gain of a reception signal comprised of a data signal to the header part of which is added a burst portion including at least a preamble signal, comprising:
    an automatic gain control amplifier for amplifying the reception signal by a gain in accordance with a gain control signal;
    a reception signal power monitor for receiving and detecting a power of the reception signal;
    a delay unit for delaying an output derived from the automatic gain control amplifier by a predetermined time;
    a burst detector for performing correlation between the output derived from the automatic gain control amplifier and the output signal of the delay unit to detect the burst portion of the reception signal and output a first burst synchronization detection signal; and
    an amplification gain controller for outputting the gain control signal to the automatic gain control amplifier, said gain control signal having first, second and third gains, in sequence, said first gain being set in advance in response to a trigger signal indicating the start of burst detection, said second gain being calculated as a function of the power of the reception signal detected by the reception signal power monitor, and said third gain being calculated as a function of the power of the reception signal produced at the output of the automatic gain control amplifier at the time the gain control signal has said second gain and in response to the first burst synchronization detection signal from the burst detector.

2. An automatic gain control circuit as set forth in claim 1, wherein the amplification gain controller fixes the gain of the automatic gain control amplifier at the third gain until the start of the next burst detection after setting the third gain.

3. An automatic gain control circuit as set forth in claim 1, wherein:
    the burst signal includes a reference signal subsequent to the preamble signal;
    the automatic gain control circuit further comprises a timing controller for detecting the reference signal upon receipt of the correlation operation result of the burst detector and outputting a second burst synchronization detection signal to the amplification gain controller; and
    the amplification gain controller shifts to a waiting mode of the trigger signal when receiving the second burst synchronization detection signal and fixes the gain of the automatic gain control amplifier at the third gain until the input of the next trigger signal.

4. An automatic gain control circuit as set forth in claim 1, wherein the reception signal power monitor is reset for every start of burst detection and detects the reception signal power after reset.

5. An automatic gain control circuit as set forth in claim 4, wherein the reception signal power monitor detects the peak value of the reception signal.

6. An automatic gain control circuit as set forth in claim 1, wherein the reception signal power monitor detects the peak value of the reception signal.

7. An automatic gain control circuit as set forth in claim 1, wherein:
   a reference signal is inserted in the data signal following the burst portion of the reception signal, and
   the amplification gain controller adjusts the value of the third gain during receipt of the reference signal.

8. An automatic gain control circuit as set forth in claim 7, wherein the amplification gain controller finds a reception signal power value in the reference signal and adjusts the value of the third gain based on a reception signal power value in the previous reference signal.

9. An automatic gain control circuit for control of an amplification gain of a reception signal comprised of a data signal to the header part of which is added a burst portion including at least a preamble signal and having the preamble signal divided into two stages of a front half section and a rear half section, comprising:
   an automatic gain control amplifier for amplifying the reception signal with a gain in accordance with a gain control signal;
   a reception signal power monitor for receiving and detecting a power of the reception signal;
   a delay unit for delaying an output derived from the automatic gain control amplifier by a predetermined time;
   a burst detector for performing correlation between the output derived from the automatic gain control amplifier and the output signal of the delay unit to detect the burst portion of the reception signal, and to output a first burst synchronization detection signal when the front half section of the preamble signal is detected and output a second burst synchronization detection signal when the rear half section of the preamble signal is detected; and
   an amplification gain controller for outputting the gain control signal to the automatic gain control amplifier, said gain control signal having first, second and third gains, in sequence, said first gain being set in advance in response to a trigger signal indicating the start of burst detection, said second gain being calculated as a function of the power of the reception signal detected by the reception signal power monitor in response to the first burst synchronization detection signal from the burst detector, and said third gain being calculated as a function of the power of the reception signal produced at the output of the automatic gain control amplifier at the time the gain control signal has said second gain and in response to the second burst synchronization detection signal from the burst detector.

10. An automatic gain control circuit as set forth in claim 9, wherein the amplification gain controller fixes the gain of the automatic gain control amplifier at the third gain until the start of the next burst detection after setting the third gain.

11. An automatic gain control circuit as set forth in claim 9, wherein:
   the burst signal includes a reference signal subsequent to the preamble signal;
   the automatic gain control circuit further comprises a timing controller for detecting the reference signal upon receipt of the correlation operation result of the burst detector and outputting a third burst synchronization detection signal to the amplification gain controller; and
   the amplification gain controller shifts to a waiting mode of the trigger signal when receiving the third burst synchronization detection signal and fixes the gain of the automatic gain control amplifier at the third gain until the input of the next trigger signal.

12. An automatic gain control circuit as set forth in claim 9, wherein the reception signal power monitor is reset for every start of burst detection and detects the reception signal power after reset.

13. An automatic gain control circuit as set forth in claim 12, wherein the reception signal power monitor detects the peak value of the reception signal.

14. An automatic gain control circuit as set forth in claim 9, wherein the reception signal power monitor detects the peak value of the reception signal.

15. An automatic gain control circuit as set forth in claim 9, wherein:
   a reference signal is inserted in the data signal following the burst portion of the reception signal, and
   the amplification gain controller adjusts the value of the third gain during the reference signal.

16. An automatic gain control circuit as set forth in claim 15, wherein the amplification gain controller finds a reception signal power value in the reference signal and adjusts the value of the third gain based on a reception signal power value in the previous reference signal.

17. An automatic gain control circuit for control of an amplification gain of a reception signal comprised of a data signal to the header part of which is added a burst portion including at least a preamble signal, comprising:
   an automatic gain control amplifier for amplifying the reception signal with a gain in accordance with a gain control signal;
   an analog-to-digital converter for converting an output signal of the automatic gain control amplifier from an analog signal to a digital signal;
   a reception signal power monitor for receiving and detecting a power of the reception signal;
   a delay unit for delaying the output derived from the automatic gain control amplifier by a predetermined time;
   a burst detector for performing correlation between the digital signal from the analog-to-digital converter and an output signal of the delay unit to detect the burst portion of the reception signal and output a first burst synchronization detection signal; and
   an amplification gain controller for outputting the gain control signal to the automatic gain control amplifier, said gain control signal having first, second and third gains, in sequence, said first gain being set in advance in response to a trigger signal indicating the start of burst detection, said second gain being calculated as a function of the power of the reception signal detected by the reception signal power monitor, said amplification gain controller integrating the digital signal from the analog-to-digital converter when the automatic gain control amplifier amplifies the reception signal with the second gains and said third gain being calculated as a function of said integrated digital signal from said analog-to-digital converter in response to the first burst synchronization detection signal from the burst detector.

18. An automatic gain control circuit as set forth in claim 17, wherein the amplification gain controller adds the second gain to a reception signal power value from the reception signal power monitor and performs calculation based on a reference signal power value not distorting the analog-to-digital converter.

19. An automatic gain control circuit as set forth in claim 17, wherein the amplification gain controller adds the third gain to a reception signal power value and performs calculation based on a reference signal power value obtained by optimizing the reception signal power after gain control.

20. An automatic gain control circuit as set forth in claim 17, wherein the amplification gain controller adds the second gain to a reception signal power value from the reception signal power monitor and performs calculation based on a first reference signal power value not distorting the analog-to-digital converter, adds the third gain to the reception signal power value, and performs calculation based on a second reference signal power value obtained by optimizing the reception signal power after gain control.

21. An automatic gain control circuit as set forth in claim 17, wherein the amplification gain controller fixes the gain of the automatic gain control amplifier at the third gain until the start of the next burst detection after setting the third gain.

22. An automatic gain control circuit as set forth in claim 17, wherein:
the burst signal includes a reference signal following the preamble signal;
the automatic gain control circuit further comprises a timing controller for detecting the reference signal upon receipt of the correlation operation result of the burst detector and outputting a second burst synchronization detection signal to the amplification gain controller; and
the amplification gain controller shifts to a waiting mode of the trigger signal when receiving the second burst synchronization detection signal and fixes the gain of the automatic gain control amplifier at the third gain until the input of the next trigger signal.

23. An automatic gain control circuit as set forth in claim 17, wherein the reception signal power monitor is reset for every start of burst detection and detects the reception signal power after reset.

24. An automatic gain control circuit as set forth in claim 23, wherein the reception signal power monitor detects a peak value of the reception signal.

25. An automatic gain control circuit as set forth in claim 17, wherein the reception signal power monitor detects a peak value of the reception signal.

26. An automatic gain control circuit as set forth in claim 17, wherein
a reference signal is inserted in the data signal following the burst portion of the reception signal, and
the amplification gain controller adjusts the value of the third gain during the reference signal.

27. An automatic gain control circuit as set forth in claim 26, wherein the amplification gain controller finds a reception signal power value in the reference signal and adjusts the value of the third gain based on a value of the reception signal power in the previous reference signal.

28. An automatic gain control circuit for control of an amplification gain of a reception signal comprised of a data signal to the header part of which is added a burst portion including at least a preamble signal and having the preamble signal divided into two stages of a front half section and a rear half section, comprising:
an automatic gain control amplifier for amplifying the reception signal with a gain in accordance with a gain control signal;
an analog-to-digital converter for converting an output signal of the automatic gain control amplifier from an analog signal to a digital signal;
a reception signal power monitor for receiving and detecting a power of the reception signal;
a delay unit for delaying an output derived from the automatic gain control amplifier by a predetermined time;
a burst detector for performing correlation between the digital signal from the analog-to-digital converter and an output signal of the delay unit to detect the burst portion of the reception signal, to output a first burst synchronization detection signal when the front half section of the preamble signal is detected, and to output a second burst synchronization detection signal when the rear half section of the preamble signal is detected; and
an amplification gain controller for outputting the gain control signal to the automatic gain control amplifier, said gain control signal having first, second and third gains, in sequence, said first gain being set in advance in response to a trigger signal indicating the start of burst detection, said second gain being calculated as a function of the power of the reception signal detected by the reception signal power monitor in response to the first burst synchronization detection signal from the burst detector, said amplification gain controller integrating the digital signal from the analog-to-digital converter when the automatic gain control amplifier amplifies the reception signal with the second gains and said third gain being calculated as a function of said integrated digital signal from said analog-to-digital converter in response to the second burst synchronization detection signal from the burst detector.

29. An automatic gain control circuit as set forth in claim 28, wherein the amplification gain controller adds the second gain to a value of the detected reception signal power from the reception signal power monitor and performs calculations based on a reference signal power value not distorting the analog-to-digital converter.

30. An automatic gain control circuit as set forth in claim 28, wherein the amplification gain controller adds the third gain to a reception signal power value and performs calculation based on a reference signal power value obtained by optimizing the reception signal power after gain control.

31. An automatic gain control circuit as set forth in claim 28, wherein the amplification gain controller adds the second gain to a value of the detected reception signal power from the reception signal power monitor and performs calculation based on a first reference signal power value not distorting the analog-to-digital converter, adds the third gain to the detected reception signal power value, and performs calculation based on a second reference signal power value obtained by optimizing the reception signal power after gain control.

32. An automatic gain control circuit as set forth in claim 28, wherein the amplification gain controller fixes the gain of the automatic gain control amplifier at the third gain until the start of the next burst detection after setting the third gain.

33. An automatic gain control circuit as set forth in claim 28, wherein:
the burst signal includes a reference signal following the preamble signal;
the automatic gain control circuit further comprises a timing controller for detecting the reference signal upon receipt of the correlation operation result of the burst detector and outputting a third synchronization detection signal to the amplification gain controller; and
the amplification gain controller shifts to a waiting mode of the trigger signal when receiving the third burst synchronization detection signal and fixes the gain of the automatic gain control amplifier at the third gain until the input of the next trigger signal.

34. An automatic gain control circuit as set forth in claim 28, wherein the reception signal power monitor is reset for every start of burst detection and detects the reception signal power after reset.

35. An automatic gain control circuit as set forth in claim 34, wherein the reception signal power monitor detects a peak value of the reception signal.

36. An automatic gain control circuit as set forth in claim 28, wherein the reception signal power monitor detects a peak value of the reception signal.

37. An automatic gain control circuit as set forth in claim 28, wherein
a reference signal is inserted in the data signal following the burst portion of the reception signal, and the amplification gain controller adjusts the value of the third gain during the reference signal.

38. An automatic gain control circuit as set forth in claim 37, wherein the amplification gain controller finds a reception signal power value in the reference signal and adjusts the value of the third gain based on a reception signal power value in the previous reference signal section.

39. An automatic gain control method for control of an amplification gain of a reception signal comprised of a data signal to the header part of which is added a burst portion including at least a preamble signal, comprising the steps of:
setting the amplification gain so as to amplify the reception signal with a first gain set in advance when starting burst detection,
amplifying the reception signal with the first gain when burst detection is started and detecting a power of the reception signal,
calculating a second gain based on detected reception signal power value and setting the amplification gain so as to amplify the reception signal with the second gain,
finding the power value of the reception signal amplified with the second gain,
performing burst detection based on a correlation operation between the reception signal amplified with the second gain and a delay signal of the reception signal, and
calculating a third gain based on the reception signal power value amplified with the found second gain when burst is detected and setting the amplification gain so as to amplify the reception signal with the third gain.

40. An automatic gain control method as set forth in claim 39, further comprising, after setting the third gain, fixing the amplification gain to the third gain until the start of a next burst detection.

41. An automatic gain control method as set forth in claim 40, wherein:
the burst portion includes a reference signal following the preamble signal and
further comprising detecting the reference signal upon receipt of the correlation operation result at the time of the burst detection,
shifting to a waiting mode of a burst detection start instruction when the reference signal is detected, and
fixing the amplification gain at the third gain until receiving the next burst detection start instruction.

42. An automatic gain control method as set forth in claim 40, wherein:
a reference signal is inserted in the data signal following the burst portion of the reception signal, and
further comprising adjusting the third gain during the reference signal.

43. An automatic gain control method as set forth in claim 42, further comprising finding a reception signal power value in the reference signal and adjusting the value of the third gain based on a reception signal power value in the previous reference signal.

44. An automatic gain control method for control of an amplification gain of a reception signal comprised of a data signal to the header part of which is added a burst portion including at least a preamble signal and having the preamble signal divided into two stages of a front half section and a rear half section, comprising the steps of:
setting the amplification gain so as to amplify the reception signal with a first gain set in advance when starting burst detection,
amplifying the reception signal with the first gain when burst detection is started and detecting a power of the reception signal,
performing burst detection of the front half section of the preamble signal based on a correlation operation between the reception signal amplified with the first gain and a delay signal of the reception signal,
calculating a second gain based on detected reception signal power value when a burst in the front half section is detected and setting the amplification gain so as to amplify the reception signal with the second gain,
finding the power value of the reception signal amplified with the second gain,
performing burst detection of the rear half section of the preamble signal based on a correlation operation between the reception signal amplified with the second gain and the delay signal of the reception signal, and
calculating a third gain based on the reception signal power value amplified with the found second gain when a burst in the rear half section is detected and setting the amplification gain so as to amplify the reception signal with the third gain.

45. An automatic gain control method as set forth in claim 44, further comprising, after setting the third gain, fixing the amplification gain to the third gain until the start of a next burst detection.

46. An automatic gain control method as set forth in claim 44, wherein:
the burst signal includes a reference signal following the preamble signal and
further comprising detecting the reference signal upon receipt of a result of the correlation operation at the time of the burst detection,
shifting to a waiting mode of a burst detection start instruction when the reference signal is detected, and
fixing the amplification gain at the third gain until receiving the next burst detection start instruction.

47. An automatic gain control method as set forth in claim 44, wherein:
a reference signal is inserted in the data signal following the burst portion of the reception signal, and
further comprising adjusting the third gain during the reference signal.

48. An automatic gain control method as set forth in claim 47, further comprising finding a reception signal power value in the reference signal and adjusting the value of the third gain based on a reception signal power value in the previous reference signal.

49. A demodulation apparatus for control of an amplification gain of a reception signal comprised of a data signal to the header part of which is added a burst portion including at least a preamble signal and demodulating the reception signal after amplification, including:

an automatic gain control circuit having an automatic gain control amplifier for amplifying the reception signal with a gain in accordance with a gain control signal;

a reception signal power monitor for receiving and detecting a power of the reception signal;

a delay unit for delaying the output derived from the automatic gain control amplifier by a predetermined time;

a burst detector for performing correlation between the output signal derived from the automatic gain control amplifier and the output signal of the delay unit to detect the burst portion of the reception signal and output a burst synchronization detection signal; and an amplification gain controller for outputting the gain control signal to the automatic gain control amplifier, said gain control signal having first, second and third gains, in sequence, said first gain being set in advance in response to a trigger signal indicating the start of burst detection, said second gain being calculated as a function of the power of the reception signal detected by the reception signal power monitor, and said third gain being calculated as a function of the power of the reception signal produced at the output of the automatic gain control amplifier at the time the gain control signal has said second gain and in response to the burst synchronization detection signal from the burst detector.

50. A demodulation apparatus as set forth in claim 49, wherein the reception signal is modulated based on orthogonal frequency division multiplexed modulation.

51. A demodulation apparatus for control of an amplification gain of a reception signal comprised of a data signal to the header part of which is added a burst portion including at least a preamble signal and having the preamble signal divided into two stages of a front half section and a rear half section and demodulating the reception signal after amplification, including:

an automatic gain control circuit having an automatic gain control amplifier for amplifying the reception signal with a gain in accordance with a gain control signal;

a reception signal power monitor for receiving and detecting a power of the reception signal;

a delay unit for delaying an output derived from the automatic gain control amplifier by a predetermined time;

a burst detector for performing correlation between an output signal derived from the automatic gain control amplifier and the output signal of the delay unit to detect the burst portion of the reception signal, and to output a first burst synchronization detection signal when the front half section of the preamble signal is detected and output a second burst synchronization detection signal when the rear half section of the preamble signal is detected; and an amplification gain controller for outputting the gain control signal to the automatic gain control amplifier, said gain control signal having first, second and third gains, in sequence, said first gain being set in advance in response to a trigger signal indicating the start of burst detection, said second gain being calculated as a function of the power detected by the reception signal power monitor in response to the first burst synchronization detection signal from the burst detector, and said third gain being calculated as a function of the power of the reception signal produced at the output of the automatic gain control amplifier at the time the gain control signal has said second gain and in response to the second burst synchronization detection signal from the burst detector.

52. A demodulation apparatus as set forth in claim 51, wherein the reception signal is modulated based on orthogonal frequency division multiplexed modulation.

53. A demodulation apparatus for control of an amplification gain of a reception signal comprised of a data signal to the header part of which is added a burst portion including at least a preamble signal and demodulating the reception signal after amplification, including:

an automatic gain control circuit having an automatic gain control amplifier for amplifying the reception signal with a gain in accordance with a gain control signal;

an analog-to-digital converter for converting an output signal of the automatic gain control amplifier from an analog signal to a digital signal;

a reception signal power monitor for receiving and detecting a power of the reception signal;

a delay unit for delaying the output derived from the automatic gain control amplifier by a predetermined time;

a burst detector for performing correlation between the digital signal from the analog-to-digital converter and an output signal of the delay unit to detect the burst portion of the reception signal and output a burst synchronization detection signal; and an amplification gain controller for outputting the gain control signal to the automatic gain control amplifier, said gain control signal having first, second and third gains, in sequence, said first gain being set in advance in response to a trigger signal indicating the start of burst detection, said second gain being calculated as a function of the power of the reception signal detected by the reception signal power monitor, said amplification gain controller integrating the digital signal from the analog-to-digital converter when the automatic gain control amplifier amplifies the reception signal with the second gain, and said third gain being calculated as a function of said integrated digital signal from said analog-to-digital converter in response to the burst synchronization detection signal from the burst detector.

54. A demodulation apparatus as set forth in claim 53, wherein the reception signal is modulated based on orthogonal frequency division multiplexed modulation.

55. A demodulation apparatus for control of an amplification gain of a reception signal comprised of a data signal to the header part of which is added a burst portion including at least a preamble signal and having the preamble signal divided into two stages of a front half section and a rear half section and demodulating the reception signal after amplification, including:

an automatic gain control circuit having an automatic gain control amplifier for amplifying the reception signal with a gain in accordance with a gain control signal;

an analog-to-digital converter for converting the output signal of the automatic gain control amplifier from an analog signal to a digital signal;

a reception signal power monitor for receiving and detecting a power of the reception signal;

a delay unit for delaying the output derived from the automatic gain control amplifier by a predetermined time;

a burst detector for performing correlation between the digital signal from the analog-to-digital converter and an output signal of the delay unit to detect the burst portion of the reception signal, to output a first burst synchronization detection signal when the front half section of the preamble signal is detected, and to output a second burst synchronization detection signal when the rear half section of the preamble signal is detected; and an amplification gain controller for outputting the gain control signal to the automatic gain control amplifier, said gain control signal having first, second and third gains, in sequence, said first gain being set in advance in response to a trigger signal indicating the start of burst detection, said second gain being calculated as a function of the power of the reception signal detected by the reception signal power monitor in response to the first burst synchronization detection signal from the burst detector, said amplification gain controller integrating the digital signal from the analog-to-digital converter when the automatic gain control amplifier amplifies the reception signal with the second gain, and said third gain being calculated as a function of said integrated digital signal from said analog-to-digital converter in response to the second burst synchronization detection signal from the burst detector.

56. A demodulation apparatus as set forth in claim 55, wherein the reception signal is modulated based on orthogonal frequency division multiplexed modulation.

* * * * *